(12) United States Patent
Tsuji et al.

(10) Patent No.: US 7,716,818 B2
(45) Date of Patent: May 18, 2010

(54) METHOD FOR TRANSFERRING A SUBSTRATE

(75) Inventors: Shinjiro Tsuji, Nara (JP); Takahiko Murata, Osaka (JP); Keiji Fujiwara, Osaka (JP); Kozo Odawara, Osaka (JP)

(73) Assignee: Panasonic Corporation, Osaka (JP)

( * ) Notice: Subject to any disclaimer, the term of this patent is extended or adjusted under 35 U.S.C. 154(b) by 119 days.

(21) Appl. No.: 11/884,036

(22) PCT Filed: Feb. 1, 2006

(86) PCT No.: PCT/JP2006/301660

§ 371 (c)(1),
(2), (4) Date: Sep. 4, 2007

(87) PCT Pub. No.: WO2006/085462

PCT Pub. Date: Aug. 17, 2006

(65) Prior Publication Data

US 2008/0193262 A1 Aug. 14, 2008

(30) Foreign Application Priority Data

Feb. 10, 2005 (JP) ............... 2005-034544
Feb. 10, 2005 (JP) ............... 2005-034551
Feb. 10, 2005 (JP) ............... 2005-034565

(51) Int. Cl.
*B23P 19/00* (2006.01)

(52) U.S. Cl. ............... 29/740; 29/743; 29/832; 29/834; 269/21

(58) Field of Classification Search ........... 29/740–743, 29/832–834; 156/556, 538; 269/21, 903; 349/187, 190
See application file for complete search history.

(56) References Cited

U.S. PATENT DOCUMENTS 7,021,357 B2 * 4/2006 Katano et al. ............... 156/556

(Continued)

FOREIGN PATENT DOCUMENTS

EP        1339098        * 8/2009

(Continued)

OTHER PUBLICATIONS

PCT Cooperation Treaty (PCT) International Preliminary Report on Patentability, issued Aug. 12, 2008.

*Primary Examiner*—Minh Trinh
(74) *Attorney, Agent, or Firm*—Wenderoth, Lind & Ponack L.L.P.

(57) ABSTRACT

A method for transferring a substrate includes moving first and second substrate holding sections opposite each other, moving a first substrate stage holding the substrate so as to be disposed between the first and second substrate holding sections, delivering the substrate from the first substrate stage to the first and second substrate holding sections by releasing the holding of the substrate by the first substrate stage and holding the substrate by the first and second substrate holding sections, moving the first and second substrate holding sections from a first substrate taking-over position to a second substrate taking-over position, moving a second substrate stage so as to be disposed in the interval between the first and second substrate holding sections at the second substrate taking-over position, and delivering the substrate to the second substrate stage by releasing the substrate and holding the substrate by the second substrate stage.

2 Claims, 24 Drawing Sheets

U.S. PATENT DOCUMENTS

| | | | |
|---|---|---|---|
| 7,089,073 B2 * | 8/2006 | Tsuji et al. | 700/114 |
| 7,220,922 B2 * | 5/2007 | Nishino et al. | 174/261 |

FOREIGN PATENT DOCUMENTS

| JP | 5-323251 | 12/1993 |
|---|---|---|
| JP | 11-14957 | 1/1999 |
| JP | 2003-76290 | 3/2003 |

\* cited by examiner

METHOD FOR TRANSFERRING A SUBSTRATE

BACKGROUND OF THE INVENTION

I. Technical Field

The present invention relates to a method for transferring substrates including glass substrates such as a liquid-crystal display substrate (LCD substrate) or a plasma display substrate (PDP substrate), and a component mounting equipment for mounting components including electronic components such as IC chips or various semiconductor devices onto these types of substrate.

II. Description of the Related Art

An example of a conventional component mounting equipment is disclosed in Japanese Patent Application Laid-Open Publication No. 2001-228452. Referring to FIG. 20, a reference numeral "1" denotes a substrate stage for holding a substrate 2. Suction holes (not illustrated) are formed in the substrate stage 1 which is a rigid body and a lower side of the substrate 2 is held by suction force acting through the suction holes. Further, a reference numeral "3" denotes a substrate transfer apparatus that transfers the substrate 2 and delivers the substrate 2 to and from the substrate stage 1. The substrate transfer apparatus 3 has a pair of support arms 4A and 4B which extend in a direction orthogonal to a direction of transferring of substrate 1 indicated by an arrow "A1". These support arms 4A and 4B have suction pads 5 for holding the lower side of the substrate 2. The substrate stage 1 moves the substrate 2 transferred from the substrate transfer apparatus 3 at a substrate taking-over potion shown in the figure to a working section which is not illustrated (Refer to an arrow "A2"). In the working sections, various mounting operations such as supply of a binding material to the substrate 2, pre-press bonding of components, and final-press bonding of these components are executed. Further, the substrate stage 1 moves from the working section to the substrate taking-over position and places the substrate 2 onto the substrate transfer apparatus 3 (Refer to an arrow "A3"). Such component mounting equipment is also disclosed in International Publication WO01/58233.

Recently, the substrates to which mounting operations are carried out by such component mounting equipments have tended to increase in size. For example, the size of the substrate is approximately on the order of 13 to 15 inches for notebook-type PC displays, 17 to 21 inches for monitor displays, and 15 to 20 inches for television displays.

In the case of the component mounting equipment shown in FIG. 20, as indicated by the arrows "A2" and "A3", either when the substrate stage 1 moves from the working section to the substrate taking-over position or when the substrate stage 1 moves from the substrate taking-over position to the working section, the substrate stage 1 needs to move not only along the transfer direction "A1" of the substrate but also in a direction orthogonal to the transfer direction "A1" for avoiding interference with the support arms 4A and 4B. Due to that movements in these two directions are required, efficient delivery of the substrate between the substrate stage and the substrate transfer apparatus at the substrate taking-over position can not be achieved. Particularly, it is difficult to efficiently move the above-mentioned large size substrate in these two directions.

Further, the necessity of that the substrate stage moves in the direction orthogonal to the transfer direction "A1" of the substrate for delivering the substrate to the substrate transfer apparatus requires increasing the dimensions of the component mounting equipment in the orthogonal direction (the dimension in a depth direction) in order to secure a moving area. The increased dimension in the depth direction increases time necessary for transferring the substrate within the component mounting equipment and also decreases maintenanceability of the component mounting equipment. Particularly, when the substrate is large as mentioned above, the increase in size of the component mounting equipment for securing the moving area is significant.

Furthermore, large warpage can be readily generated for the large size substrate comparing with a small substrate. When the substrate 2 transferred from the substrate transfer apparatus 3 to the substrate stage 1 is warped and has decreased flatness, a positional shift of the substrate 2 is readily produced upon delivery of the substrate 2. The positional shift of the substrate during the delivery can lower operational accuracy at the working section. For example, the positional shift of the substrate during delivery can lower accuracy of mounting position when the pre-press bonding is executed. Further, the warped substrate causes air leakage which extends time necessary for the suction force to rise to an efficient value, resulting in tact loss.

SUMMARY OF THE INVENTION

An object of the present invention is to improve efficiency of delivery of a substrate at a substrate taking-over position and to reduce dimension of a component mounting equipment in a depth direction thereof intersects a transfer direction of the substrate. Another object of the present invention is to achieve transfer of the substrate from the substrate transfer apparatus to the substrate stage with maintaining high flatness for which warpage has been corrected.

A first aspect of the present invention a component mounting equipment, comprising a substrate transfer apparatus for transferring a substrate from a first substrate taking-over position to a second substrate taking-over position, wherein the substrate transfer apparatus comprises, first and second guide portions extending in a transfer direction from the first substrate taking-over position toward the second substrate taking-over position and being opposite to each other with an interval in a direction that intersects the transfer direction, first and second substrate holding sections adapted to be moved along the first and second guide portions, being opposite to each other with an interval in a direction that intersects the transfer direction, and releasably holding a lower surface of the substrate, and a moving section reciprocatingly moving the first and second substrate holding sections between the first and second substrate taking-over positions along the first and second guide portions with maintaining a relative position in the transfer direction between the first and second substrate holding sections.

The first and second substrate holding sections releasably holding the lower surface of the substrate is opposed to each other with the interval in the direction intersecting the transfer direction of the substrate, that is, in the direction intersecting the direction in which the first and second guide portions extend. As a result, at the first and second substrate taking-over positions, another mechanism for delivering the substrate to the first and second substrate holding sections can approach or move to the interval between the first and second substrate holding sections by merely moving in the transfer direction. In other words, when such other mechanism moves to the interval between the first and second substrate holding sections, there is no need to move in the direction intersecting the transfer direction in addition to moving in the transfer direction of the substrate for avoiding interference with the first and second substrate holding sections. Further, such other mechanism can leave the first and second substrate taking-over positions by merely moving in the transfer direction of the substrate. As a result, the delivery of the substrate can be performed efficiently and rapidly between the substrate transfer apparatus and such other mechanism for holding the substrate at the first and second substrate taking-over positions. Further, dimension of the component mounting equipment and, specifically, the dimension in a depth direction intersecting the transfer direction can be reduced.

The substrate is, for example, a glass substrate such as a liquid-crystal display substrate or plasma display substrate.

Specifically, the first substrate holding section comprises a first substrate placement portion on which one of two mutually opposing sides of the substrate is placed. The second substrate holding section comprises a second substrate placement portion on which the other of the two mutually opposing sides of the substrate is placed.

Further, the substrate transfer apparatus further comprises suction sections formed in the first and second substrate placement portions, and a vacuum suction mechanism releasably causing a suction force on the suction sections.

The suction section is, for example, a suction hole formed in the first and second substrate placement sections or a suction pad provided in the first and second substrate placement sections. The first and second substrate placement sections may also hold the substrate mechanically.

For example, the substrate transfer apparatus comprises a pair of mutually opposing support structures extending upward, and a pair of beam structures extending in the transfer direction and supported at upper ends of the support structures. The first and second guide portions are respectively fixed to the beam structures and parallel to each other.

The component mounting equipment of the present invention comprises a mounting operation apparatus for performing a mounting operation in an working section to the substrate delivered from the substrate transfer apparatus at the second substrate taking-over position. The mounting operation apparatus comprises, a substrate stage on which the substrate is placed, a holding mechanism releasably holding the substrate on the substrate stage, a substrate stage moving section moving the substrate stage between the substrate taking-over position and the working section, and moving the substrate stage, at the substrate taking-over position, to a first height position below the substrate held by the substrate holding sections, a second height position in which the substrate stage abuts against the lower surface of the substrate held by the substrate holding sections, and a third height position above the substrate holding sections, a sensor for detecting a holding force on the substrate to the substrate stage by the holding mechanism, a warpage correction section disposed at the substrate taking-over position and being capable of moving to a first position with an interval from the substrate stage and a second position in which the warpage correction section abuts against an upper surface of the substrate to push the substrate against the substrate stage, and a control section starting the holding of the substrate by the holding mechanism after completion both of moving the substrate stage to the substrate taking-over position and moving the substrate stage from the first height position to the second height position, and then, if a detection value by the sensor is equal to or more than a predetermined threshold, after releasing the holding of the substrate by the substrate holding section, moving the substrate stage from the second height position to the third height position and moving the substrate stage from the substrate taking-over position to the working section by the substrate stage moving section, whereas, if the detection value is less than the threshold, moving the warpage correction section from the first position to the second position.

Working sections include, for example, an adhesive material applying section for supplying a adhesive material to a mounting region of the substrate, a pre-pres bonding section that aligns a component with the mounting region to which the adhesive material has been applied and pre-press bonds the component to the mounting region using a relatively small press bonding force, and a final press bonding section that fixes the pre-press bonded component using a relatively large press bonding force.

When the second substrate stage is at the second substrate taking-over position and the second substrate stage is at the second height position where the second substrate stage abuts against the lower surface of the substrate held by the first and second substrate holding sections of the substrate transfer apparatus, the holding force with which the holding mechanism holds the substrate on the second substrate stage is detected by the sensor. If the detection value of the holding force detected by the sensor is less than a threshold value, that is, if the holding force of the holding mechanism is insufficient, the substrate is pushed against the second substrate stage by the warpage correction section. Therefore, at the second substrate taking-over position, the substrate can be transferred from the first and second substrate holding sections of the substrate transfer apparatus to the substrate stage of the mounting operation apparatus with maintaining high flatness of the substrate in which the warpage has been corrected. Further, the positional displacement of the substrate during delivery due to warpage of the substrate can be prevented. Furthermore, because the holding force with which the holding mechanism holds the substrate on the second substrate stage rises rapidly as a result of correcting the warpage of the substrate, the time necessary for delivering the substrate can be shortened and the takt time can be improved.

Various operations such as the supply of adhesive material to the substrate, the pre-press bonding of the component, and the final press bonding of the component are performed by the working section. Because the warpage of the substrate stage is corrected and the substrate is held in a state where there is no positional displacement, the operational accuracy of the working section is enhanced. For example, where the working section is the pre-press bonding section, accuracy of placement position of the component with respect to a mounting region can be improved. Furthermore, where the working section is the final press bonding section, displacement of the placement position of the component while the final press bonding can be prevented.

The warpage correction section comprises a cylinder having a rod being capable of moving to positions corresponding to the first and second positions and a cushion pad attached to a leading end of the rod.

The cylinder may be a pneumatic or hydraulic cylinder. Further, a system for raising and falling the cushion pads by means of an electric actuator such as a solenoid can also be adopted in stead of the cylinder.

Specifically, the holding mechanism comprises a suction section provided on the upper surface of the substrate stage, and a vacuum suction mechanism releasably causing a suction force on the suction section. The sensor comprises a vacuum pressure sensor for detecting the suction force acting on the suction section by the vacuum suction mechanism.

More specifically, the substrate stage comprises a rigid portion on which a lower surface side of a first region of the substrate adjacent to a mounting region for the working section is placed, and a concave portion formed in a position opposite to a lower surface side of a second region of the substrate other than the first region. The holding mechanism comprises a suction hole formed in the rigid portion of the substrate stage, a suction pad disposed in the concave portion of the substrate stage, a first vacuum suction mechanism causing a suction force on the suction hole, and a second vacuum suction mechanism causing a suction force on the suction pad. The sensor includes a first vacuum pressure sensor for detecting the suction force exerted by the first vacuum suction mechanism and a second vacuum pressure sensor for detecting the suction force exerted by the second vacuum suction mechanism.

The rigid portion is a portion has rigidity so not to be substantially deformed when the substrate is placed thereon.

With regard to suction pad, flexibility means that the suction pad is deformed to a certain extent in a vertical direction when a substrate is placed thereon and that the suction pad can return to its original shape if the substrate placed thereon is removed.

Various operations are executed by the working section with respect to the mounting region of the substrate. The mounting region can be held in a state of high flatness where warpage has been corrected by reliably supporting the lower surface side of the first region adjacent to the mounting region by a rigid portion. As a result, the position and shape of the mounting region of the substrate can be accurately maintained during the operations performed by the working section.

On the other hand, because spaced apart from the mounting region, comparing with the first region, the second region of the substrate has lower necessity for reliably supporting the lower surface side in view of the various operations by the working section. Leakage does not occur because the suction pad is tightly contacted with the lower surface of the second region of the substrate and the substrate is reliably held on the substrate stage by the suction force acting from the suction pad. Further, because the suction force acts reliably on the lower surface of the substrate from the suction pad, the first region of the substrate adjacent to the mounting region is pushed strongly against the rigid portion of the substrate stage and supported on the rigid portion with high flatness.

Further, the suction forces acting on the suction hole and suction pad from the first and second vacuum suction mechanisms are detected by first and second vacuum pressure sensors and the warpage correction section is operated based on the detected suction forces. Therefore, the substrate can be moved from the substrate holding sections of the substrate transfer apparatus to the substrate stage of the mounting operation device with maintaining a state where the warpage is more reliably corrected and there is no positional displacement.

A second aspect of the present invention provides a method for transferring a substrate, comprising, moving first and second substrate holding sections opposite to each other with an interval in a direction intersecting a transfer direction of a substrate to a first substrate taking-over position, moving a first substrate stage being holding the substrate in the transfer direction so as to be disposed in the interval between the first and second substrate holding sections located in the first substrate taking-over position, delivering the substrate from the first substrate stage to the first and second substrate holding sections by releasing the holding of the substrate by the first substrate stage and starting holding of the substrate by the first and second substrate holding sections, moving the first and second substrate holding sections having held the substrate from the first substrate taking-over position to a second substrate taking-over position, moving a second substrate stage in the transfer direction so as to be disposed in the interval between the first and second substrate holding sections located at the second substrate taking-over position, and delivering the substrate from the first and second substrate holding sections to the second substrate stage by releasing the holding of the substrate by the first and second substrate holding sections and starting holding of the substrate by the second substrate stage.

The delivering of the substrate from the first and second substrate holding sections to the second substrate stage is executed by means of the following procedure, for example. The procedure involves raising the second substrate stage from a first height position spaced apart from the lower surface of the substrate held by the first and second substrate holding sections to a second height position in which the second substrate stage abuts against the lower surface of the substrate held by the first and second substrate holding sections, starting holding of the substrate to the second substrate stage by a holding mechanism, detecting a holding force on the substrate to the second substrate stage by the holding mechanism by a sensor, if a detection value by the sensor is equal to or more than a predetermined threshold, moving the second substrate stage from the second height position to a third height position in which the substrate is spaced apart from the first and second substrate holding sections after the holding of the substrate by the first and second substrate holding sections is released, and if the detection value of the sensor is less than the threshold value, pushing the substrate onto the second substrate stage by a warpage correction section.

According to the present invention, the delivery of the substrate at the substrate taking-over position can be executed efficiently and rapidly because the first and second holding sections releasably holding the lower surface of the substrate is opposed to each other with the interval in the direction intersecting the transfer direction of the substrate. Further, the dimension in the depth direction intersecting the substrate transfer direction of the component mounting equipment can be reduced. As a result, the transferring time of the substrate within the component mounting equipment can be shortened and maintenanceability can also be improved. Especially, even in the case of a large substrate, the delivery of the substrate can be executed efficiently and the dimension in the depth direction of the component mounting equipment can be minimized.

Further, when the second substrate stage is at the second substrate taking-over position and the second substrate stage is at the second height position at which it abuts against the lower surface of the substrate held by the first and second substrate holding sections of the substrate transfer apparatus, in cases where the detection value of the holding force detected by the sensor is less than a threshold, that is, in cases where the holding force of the holding mechanism is insufficient, the substrate is pushed against the second substrate stage by the warpage correction section. Therefore, the substrate can be delivered from the first and second substrate holding sections of the substrate transfer apparatus to the second substrate stage in a state of high flatness in which the warpage has been corrected. Further, the positional displacement of the substrate during delivery due to warpage of the substrate can be prevented. As a result, the accuracy of the mounting operation for the substrate with respect to the working section can be improved. Furthermore, because the holding force with which the holding mechanism holds the substrate on the substrate stage rises rapidly due to the correction of the warpage of the substrate, the time necessary for delivering the substrate can be shortened and the takt can be improved.

DETAILED DESCRIPTION OF THE INVENTION

Figure 1:
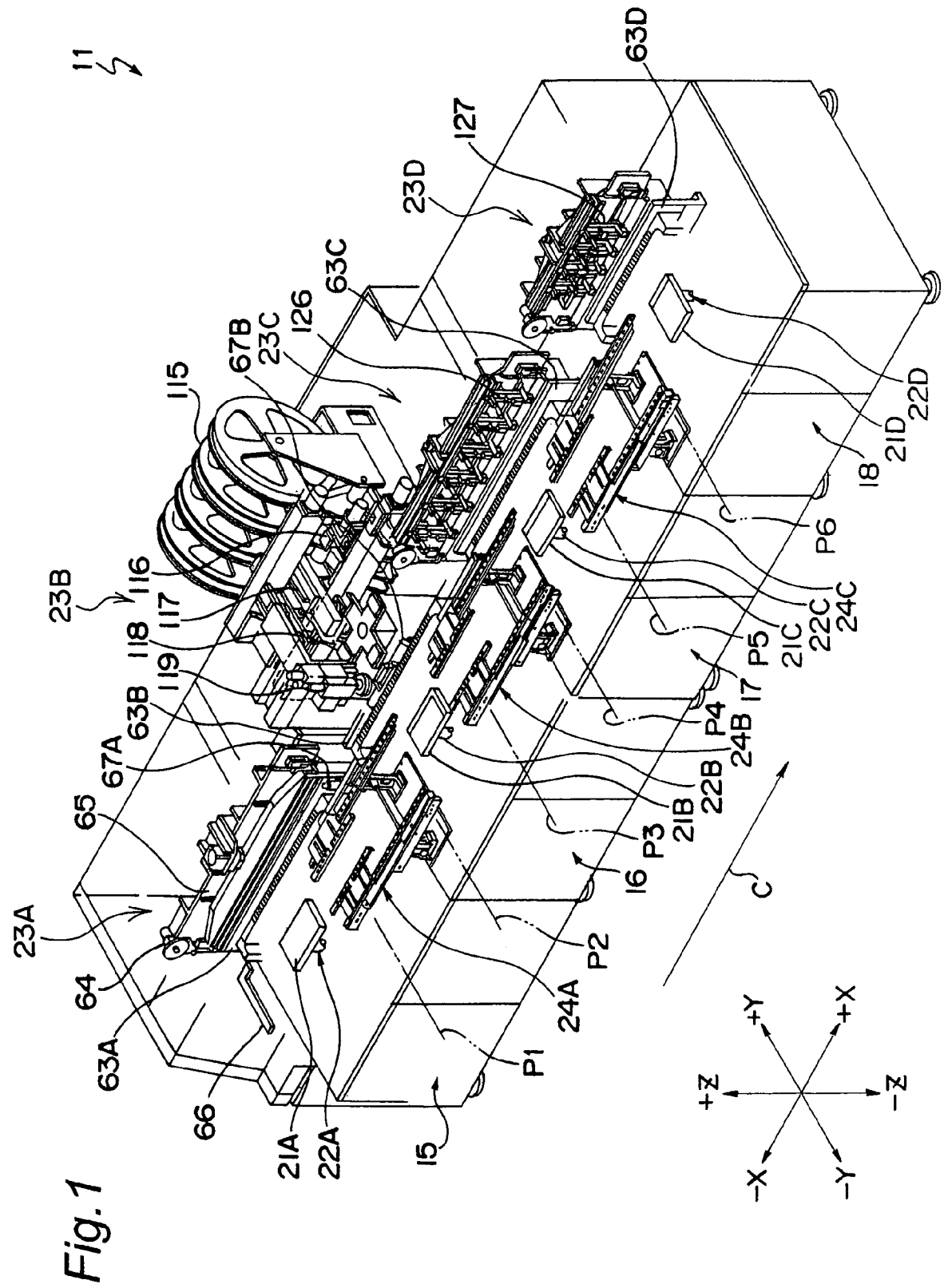
FIG. 1 is a perspective view of a component mounting equipment according to an embodiment of the present invention.
Figure 2:
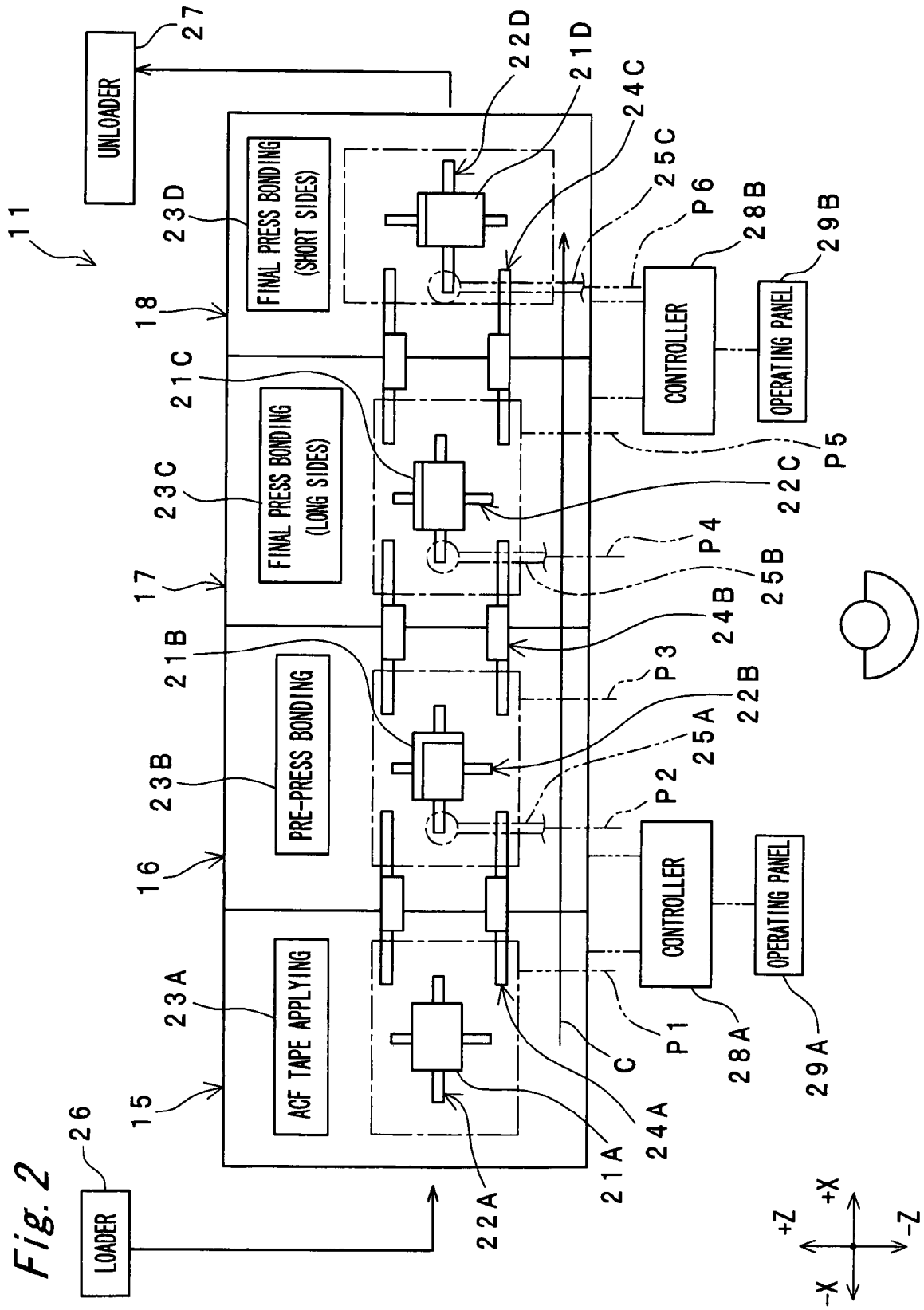
FIG. 2 is a schematic plain view of the component mounting equipment according to the embodiment of the present invention.

FIGS. 1 and 2 show a component mounting equipment 11 according to an embodiment of the present invention. The component mounting equipment 11 is an apparatus for mounting a component 13 onto a substrate 12 shown in FIG. 3.

Figure 3:
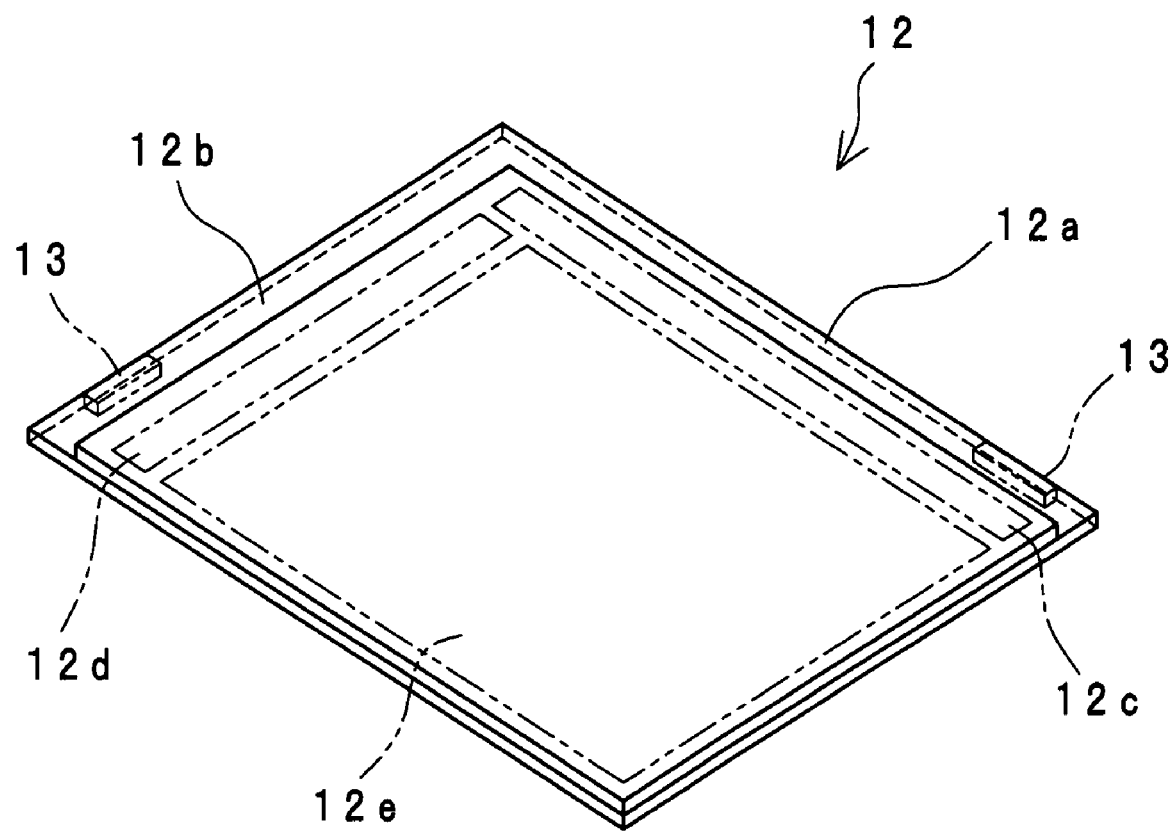
FIG. 3 is a perspective view of an LCD panel.

The substrate 12 will now be described with reference to FIG. 3. In this embodiment, substrate 12 is a liquid-crystal display substrate (LCD substrate). However, substrate 12 may be a glass substrate such as a plasma display substrate (PDP substrate) or may be a substrate other than a glass substrate. The substrate 12 has an oblong shape in plain view. A long and narrow region extending along one of a pair of opposite long sides of the substrate 12 is a first mounting region 12a in which the component 13 is mounted. Further, the long and narrow region extending along one of a pair of opposite short sides is a second mounting region 12b in which the component 13 is mounted. A portion close to the first mounting region 12a of the substrate 12 is referred to as a first supported portion 12c hereinbelow. Further, the portion close to the second mounting region 12b of the substrate 12 is referred to as a second supported portion 12d. Furthermore, portions other than the first and second supported portions 12c and 12d of the substrate 12, in other words, the portion including the region close to a center of the substrate 12 spaced apart from the first and second mounting regions 12a and 12b is referred to as a third supported portion 12e.

An overview of the basic functions and constitution of the component mounting equipment 11 will now be provided with reference to FIGS. 1 and 2. The component mounting equipment 11 is provided with an ACF applying apparatus 15, a pre-press bonding apparatus 16, a first final press bonding apparatus 17, and a second final press bonding apparatus 18 (permanent operation device). The ACF applying apparatus 15 applies an anisotropic conductive film tape (ACF tape) onto the first and second mounting regions 12a and 12b of the substrate 12. The pre-press bonding apparatus 16 places or pre-press bonds the component 13 onto the first and second mounting regions 12a and 12b with a predetermined press bonding force. The first final press bonding apparatus 17 permanently secures or final press bonds the component 13 that has been pre-press bonded in the first substrate region 12a with a press bonding force larger than that of the pre-press bonding apparatus 16. The second final press bonding apparatus 18 secures or final press bonds the component 13 that has been pre-press bonded in the second mounting region 12b with a press bonding force larger than that of the pre-press bonding apparatus 16.

The ACF applying apparatus 15, pre-press bonding apparatus 16, first final press bonding apparatus 17, and second final press bonding apparatus 18 comprise substrate stages 21A, 21B, 21C, and 21D for holding substrate 12, XYZθ tables 22A, 22B, 22C, and 22D that move the substrate stages 21A to 21D, and working sections 23A, 23B, 23C, and 23D that execute respective process of the component mounting apparatus. Further, the pre-press bonding apparatus 16, first final press bonding apparatus 17, and second final press bonding apparatus 18 comprise substrate transfer apparatuses 24A, 24B, and 24C. Furthermore, the pre-press bonding apparatus 16, first final press bonding apparatus 17, and second final press bonding apparatus 18 comprise warpage correction apparatuses 25A, 25B, and 25C (schematically illustrated in FIG. 2). The structure of the XYZθ tables 22A to 22D is the same. Further, the structure of the substrate transfer apparatuses 24A to 24C is the same. Furthermore, the structure of the warpage correction apparatuses 25A to 25C is the same.

The ACF applying apparatus 15, pre-press bonding apparatus 16, first final press bonding apparatus 17, and second final press bonding apparatus 18 are disposed on a single virtual straight line (a virtual straight line extending in the X-axis direction in FIG. 2). The substrate 12 fed into the component mounting equipment 11 by a loader 26 shown in FIG. 2 is transferred from the ACF applying apparatus 15 to the pre-press bonding apparatus 16, first final press bonding apparatus 17, and second final press bonding apparatus 18 in this order in a direction of transferring denoted by an arrow "C" (the +X direction in FIG. 2) along the virtual straight line, and then carried outside the component mounting equipment 11 by an unloader 27 shown in FIG. 2.

First, the substrate 12 is transferred from the loader 26 to the substrate stage 21A of the ACF applying apparatus 15. The substrate stage 21A then moves to the working section 23A. Following completion of an ACF applying process with respect to substrate 12, the substrate stage 21A moves to a first substrate taking-over position P1 within the ACF applying apparatus 15. At the first substrate taking-over position P1, the substrate 12 is delivered from the substrate stage 21A to the substrate transfer apparatus 24A. The substrate 12 is transferred from the first substrate taking-over position P1 to a second substrate taking-over position P2 in the pre-press bonding apparatus 16 by the substrate transfer apparatus 24A.

At the second substrate taking-over position P2, the substrate 12 is delivered from the substrate transfer apparatus 24A to the substrate stage 21B of the pre-press bonding apparatus 16. Thereafter, the substrate stage 21B moves to the working section 23B. Following the completion of a pre-press bonding process with respect to the substrate 12, the substrate stage 21B moves to a third substrate taking-over position P3 in the pre-press bonding apparatus 16. At the third substrate taking-over position P3, the substrate 12 is delivered from the substrate stage 21B to the substrate transfer apparatus 24B. The substrate 12 is transferred from the third substrate taking-over position P3 to a fourth substrate taking-over position P4 in the first final press bonding apparatus 17 by the substrate transfer apparatus 24B.

At the fourth substrate taking-over position P4, the substrate 12 is delivered from the substrate transfer apparatus 24B to the substrate stage 21C of the first final press bonding apparatus 17. Thereafter, the substrate stage 21C moves to the working section 23C. Following completion of a final press bonding process with respect to the first mounting region 12a of the substrate 12, the substrate stage 21C moves to a fifth substrate taking-over position P5 in the first final press bonding apparatus 17. At the fifth substrate taking-over position P5, the substrate 12 is delivered from the substrate stage 21C to the substrate transfer apparatus 24C. The substrate 12 is transferred from the fifth substrate taking-over position P5 to a sixth substrate taking-over position P6 in the second final press bonding apparatus 18 by the substrate transfer apparatus 24C.

At the sixth substrate taking-over position P6, the substrate 12 is delivered from the substrate transfer apparatus 24C to the substrate stage 21D of the second final press bonding apparatus 18. Thereafter, the substrate stage 21D moves to the working section 23D. Following completion of a final press bonding process with respect to the second mounting region 12b of the substrate 12, the substrate is transferred from the substrate stage 21D to the unloader 27.

During the transfer of the substrate 12 from the substrate transfer apparatuses 24A to 24C to the substrate stages 21B to 21D at the second, fourth, and sixth substrate taking-over positions P2, P4, and P6, processes for correcting the warpage of the substrate 12 by the warpage correction apparatuses 25A to 25C as executed if necessary.

As schematically shown in FIG. 2, a controller 28A that controls the ACF applying apparatus 15 and pre-press bonding apparatus 16 is provided and an operating panel 29A that allows the operator to input instructions and so on is electrically connected to the controller 28A. Likewise, the first and second final press bonding apparatuses 17 and 18 are controlled by a common controller 28B and an operating panel 29B is electrically connected to the controller 28B. However, a controller and an operating panel may also be provided for each of the ACF applying apparatus 15, pre-press bonding apparatus 16, first final press bonding apparatus 17, and second final press bonding apparatus 18 respectively. Conversely, a single controller and operating panel capable of controlling all of these apparatuses may also be provided.

The ACF applying apparatus 15, pre-press bonding apparatus 16, first final press bonding apparatus 17, and second final press bonding apparatus 18 will be described in this order.

Figure 4:
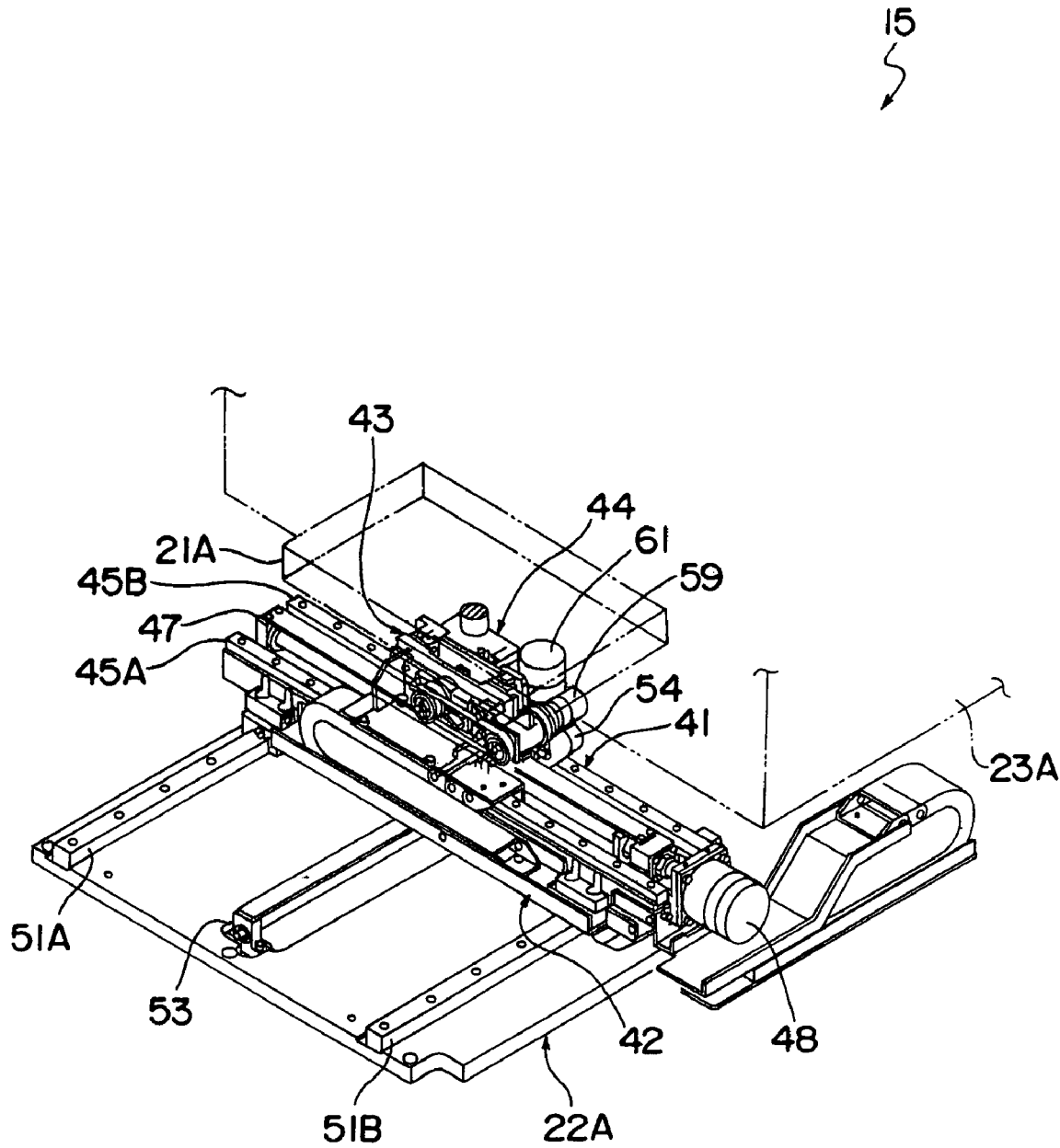
FIG. 4 is a partial perspective view of the ACF applying apparatus.
Figure 4:
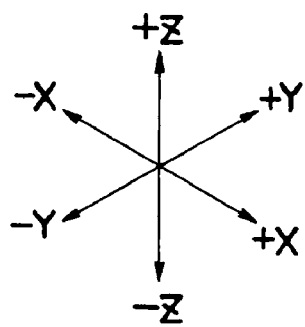

The ACF applying apparatus 15 will now be described with reference to FIGS. 1, 2, and 4 to 7. As shown in FIGS. 1, 2, and 4, the ACF applying apparatus 15 comprises the substrate stage 21A, the XYZθ table 22A, and the working section 23A.

Figure 6A:
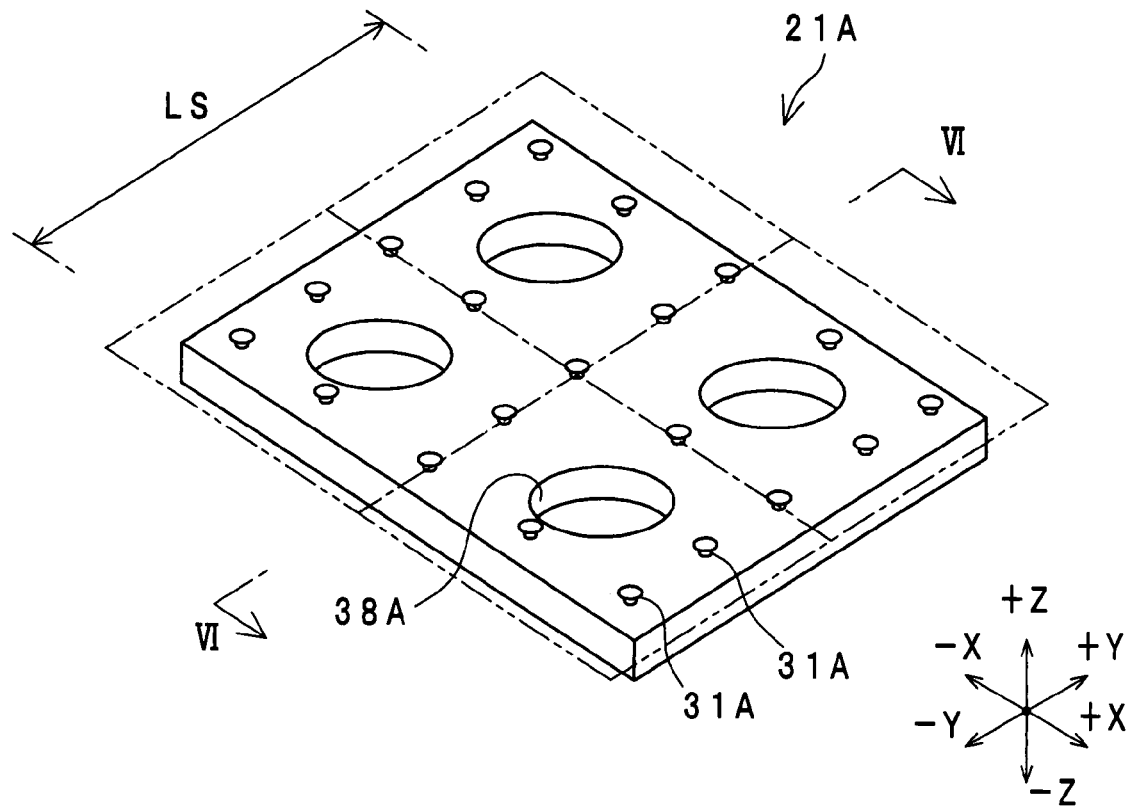
FIG. 6A is a perspective view of a substrate stage of the ACF applying apparatus.
Figure 6B:
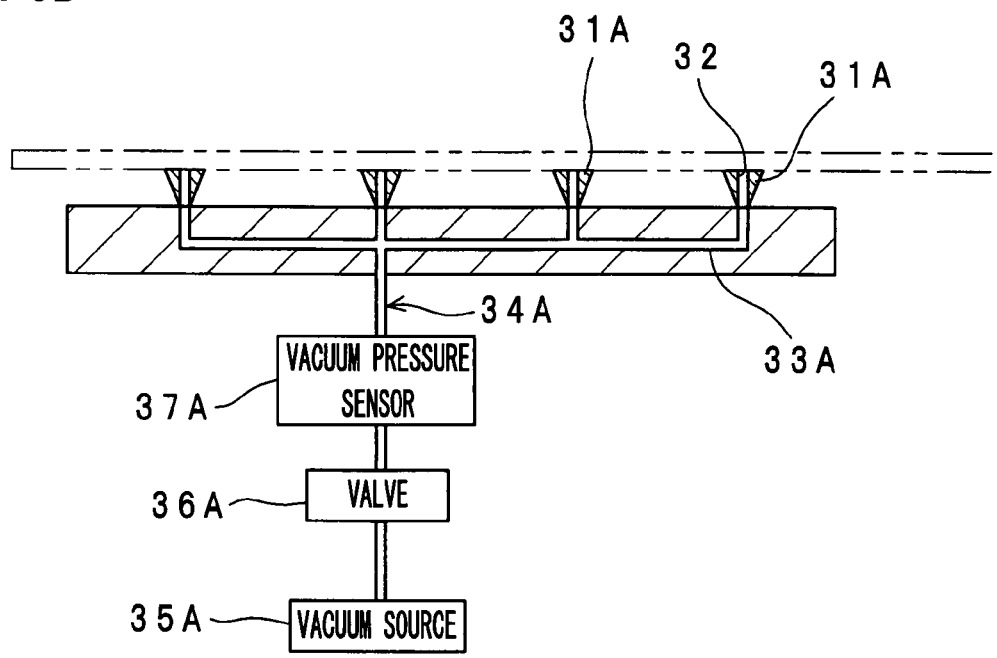
FIG. 6B is a schematic cross-sectional view along a line VI-VI in FIG. 6.

The substrate 12 supplied by the loader 26 is placed on the substrate stage 21A. Further, the substrate stage 21A sucks to hold the lower surface side of the substrate 12A placed thereon. Referring to FIGS. 6A and 6B, the substrate stage 21A has an oblong shape in plain view where similar ratio of lengths of long and short sides as that for the substrate 12, whereas dimensions of the long and short sides are all shorter than those of the substrate 12. The first and second mounting regions 12a and 12b (See FIG. 3) of the substrate 12 placed on the substrate stage 21A are located outside the substrate stage 21A in plain view.

A plurality of flexible suction pads 31A are disposed over the whole of an upper surface of the substrate stage 21A. Each of the suction pads 31A has a through hole 32 formed therein so as to penetrate the suction pad 31A. Lower ends of the through holes 32 are fluidly connected to a vacuum source 35A via a suction passage 34A including an internal passage 33A formed within the substrate stage 21A. Further, a valve 36A and a vacuum pressure sensor 37A are interposed in the suction passage 34A.

When the valve 36A is opened, a suction force acts on the suction pads 31A via the suction passage 34A from the vacuum source 35A and the lower surface side of the substrate 12 is held onto the substrate stage 21 by the suction force. On the other hand, when the valve 36A is closed, the suction passage 34A is blocked and the suction force of the vacuum source 35A does not act on the suction pad 31A.

In order to lighten the substrate stage 21A without reducing the strength thereof, four circular holes 38A penetrating in the thickness direction are formed in the substrate stage 21A.

Figure 7:
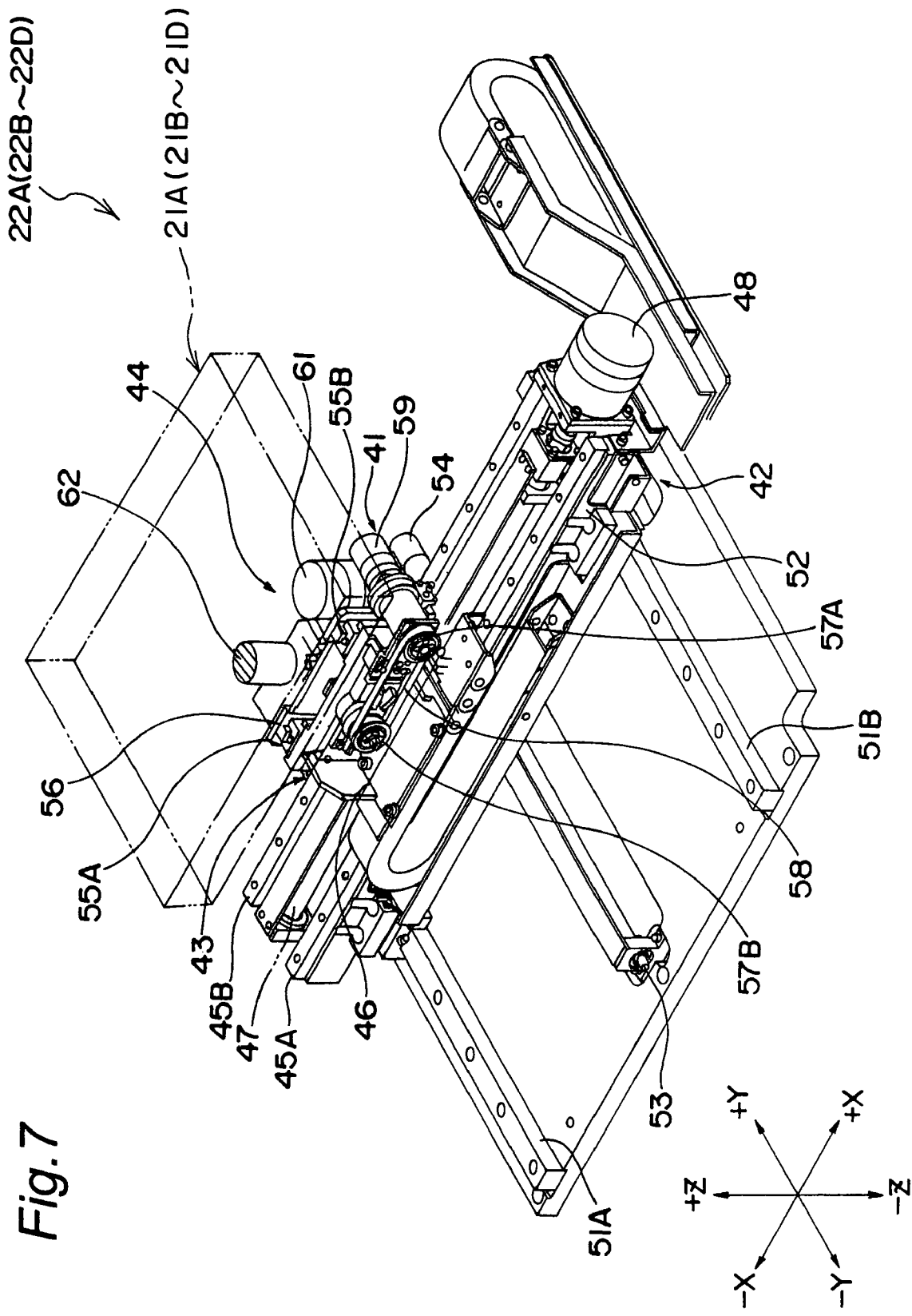
FIG. 7 is a perspective view of an XYZθ table.

The XYZθ table 22A is mechanically connected to a lower surface side of the substrate stage 21A and linearly moves on and rotates the substrate stage 21A within the ACF applying apparatus 15. Referring to FIG. 7, the XYZθ table 22A comprises an X-axis drive mechanism 41 that moves the substrate stage 21A in an X-axis direction (the +X direction and −X direction), a Y-axis drive mechanism 42 that moves the substrate stage 21A in a Y-axis direction (the +Y direction and −Y direction), a Z-axis drive mechanism 43 that moves the substrate stage 21A in a Z-axis direction (the +Z direction and −Z direction), and a θ-axis drive mechanism 44 that rotates the substrate stage 21A about the Z axis.

The X-axis drive mechanism 41 comprises a pair of linear motion rails 45A and 45B extending in the X-axis direction and a slider 46 guided by the linear motion rails 45A and 45B so as to be capable of moving in the X-axis direction. Further, the X-axis drive mechanism 41 comprises a ball screw 47 extending in the X-axis direction onto which a nut portion (not shown) of the slider 46 is screwed and a motor 48 that rotationally drives the ball screw 47. When the ball screw 47 is rotated by the motor 48, the slider 46 moves in the X-axis direction in accordance with the direction of rotation. The X-axis drive mechanism 41 is mounted on the Y-axis drive mechanism 42.

The Y-axis drive mechanism 42 comprises a pair of linear motion rails 51A and 51B extending in the Y-axis direction and a slider 52 guided by the linear motion rails 51A and 51B so as to be capable of moving in the Y-axis direction. Further, the Y-axis drive mechanism 42 comprises a ball screw 53 extending in the Y-axis direction onto which a nut portion (not shown) of the slider 52 is screwed and a motor 54 that rotationally drives the ball screw 53. When the ball screw 53 is turned by the motor 54, the slider 52 moves in the Y-axis direction in accordance with the direction of rotation. The X-axis drive mechanism 41 is mounted on the slider 52.

The Z-axis drive mechanism 43 comprises a pair of linear motion rails 55A and 55B extending in the Z-axis direction and provided on the slider 46 of the X-axis drive mechanism 41 as well as a slider 56 guided by the linear motion rails 55A and 55B so as to be capable of moving in the Z-axis direction. A substrate stage 21A is attached to the slider 56 via the θ-axis drive mechanism 44. The rotation of the motor 59 is transmitted to the slider 56 as linear motion via a transmission mechanism comprising pulleys 57A and 57B, a belt 58, and an eccentric cam mechanism (not illustrated). The slider 56 moves in the Z-axis direction in accordance with the direction of rotation of the motor 59.

The θ-axis drive mechanism 44 is mounted on the slider 56 of the Z-axis drive mechanism 43. The θ-axis drive mechanism 44 comprises a rotational shaft 62 extending in the Y-axis direction and rotationally driven by the motor 61. The substrate stage 21A is fixed to the rotational shaft 62.

The working section 23A has various mechanisms necessary for executing the ACF applying process to the substrate 12. Referring to FIG. 1, the working section 23A comprises a backup stage 63A for supporting the first and second mounting regions 12a and 12b of the substrate 12 at the lower surface side thereof, an ACF supply section 64 that delivers ACF tape in an amount corresponding to the length of the first and second mounting regions 12a and 12b respectively, an ACF applying head 65 for applying the ACF tape delivered by the ACF supply section 64 by pressing same onto the first and second mounting regions 12a and 12b, and a panel control device 66 and under camera 67A for alignment.

Figure 5:
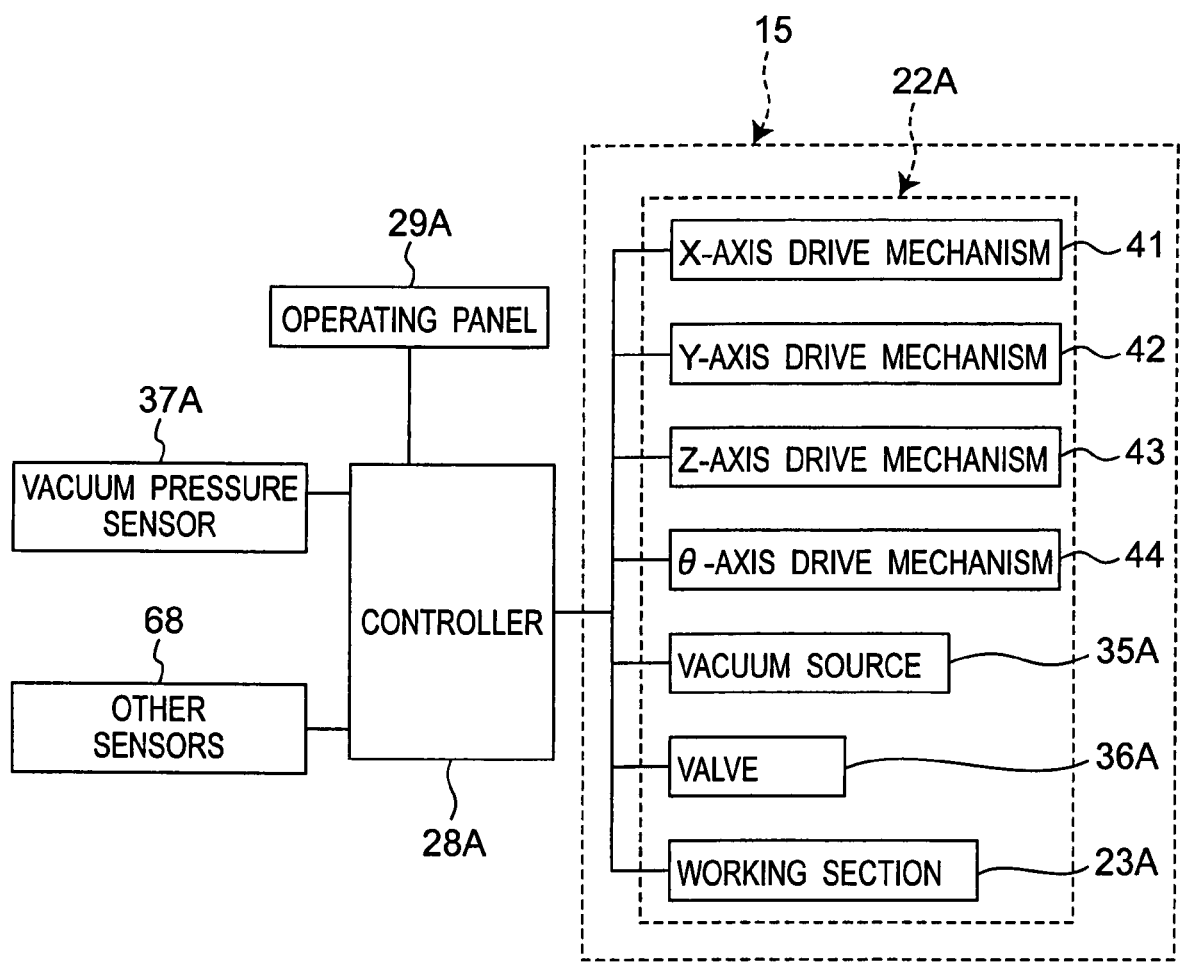
FIG. 5 is a block diagram of the ACF applying apparatus.

Referring to FIG. 5, the controller 28A controls the operations of the XYZθ table 22A of the ACF applying apparatus 15, the vacuum source 35A, the valve 36A, and the working section 23A on the basis of an instruction input by the operating panel 29A and detection values by the vacuum pressure sensor 37A and other sensors 68 (including the above-mentioned under camera 67A).

The operation of the ACF applying apparatus 15 will be described. When the substrate 12 is placed from the loader 26 onto the substrate stage 21A, the valve 36A is opened and therefore the suction force by the vacuum source 35A acts on the lower surface side of the substrate 12 via the suction passage 34A and suction pads 31A. The lower surface side of the substrate 12 is held onto the substrate stage 21A by this suction force. An air leakage does not occur because the suction pads 31A tightly contact the lower surface side of the substrate 12, and therefore the substrate 12 is reliably held on the substrate stage 21A. Further, warpage of the substrate 12 is corrected by the strong suction force acting on the lower side of the substrate 12 via the suction pads 31A. The detection values by the vacuum pressure sensor 37 are used for checking whether the substrate 12 is held onto the substrate stage 21A with an adequate holding force.

Thereafter, the XYZθ table 22A moves the substrate stage 21A holding the substrate 12 to the working section 23A. In the working section 23A, the ACF tape is applied onto the first and second mounting regions 12a and 12b of the substrate 12. For example, the first mounting region 12a of the substrate 12 is placed in alignment onto the backup stage 63A, and then the ACF tape delivered by the ACF supply section 64 is applied onto the first mounting region 12a by the ACF applying head 65. Thereafter, the substrate stage 21 is rotated in the θ direction by 90 degrees by the XYZθ table 22 so that the second mounting region 12b is placed in alignment on the backup stage 63A. Then, the ACF tape is applied also onto the second mounting region 12b.

Following completion of the applying of the ACF tape onto the first and second mounting regions 12a and 12b, the XYZθ table 22A moves the substrate stage 21A holding the substrate 12 to the first substrate taking-over position P1. At the first substrate taking-over position P1, the substrate 12 is delivered from the substrate stage 21A to the substrate transfer apparatus 24A. The delivering of the substrate 12 will be described latter in detail. After the substrate 12 has been delivered, the XYZθ table 22A returns the substrate stage 21A to the substrate taking-over position for the loader 26.

Figure 8:
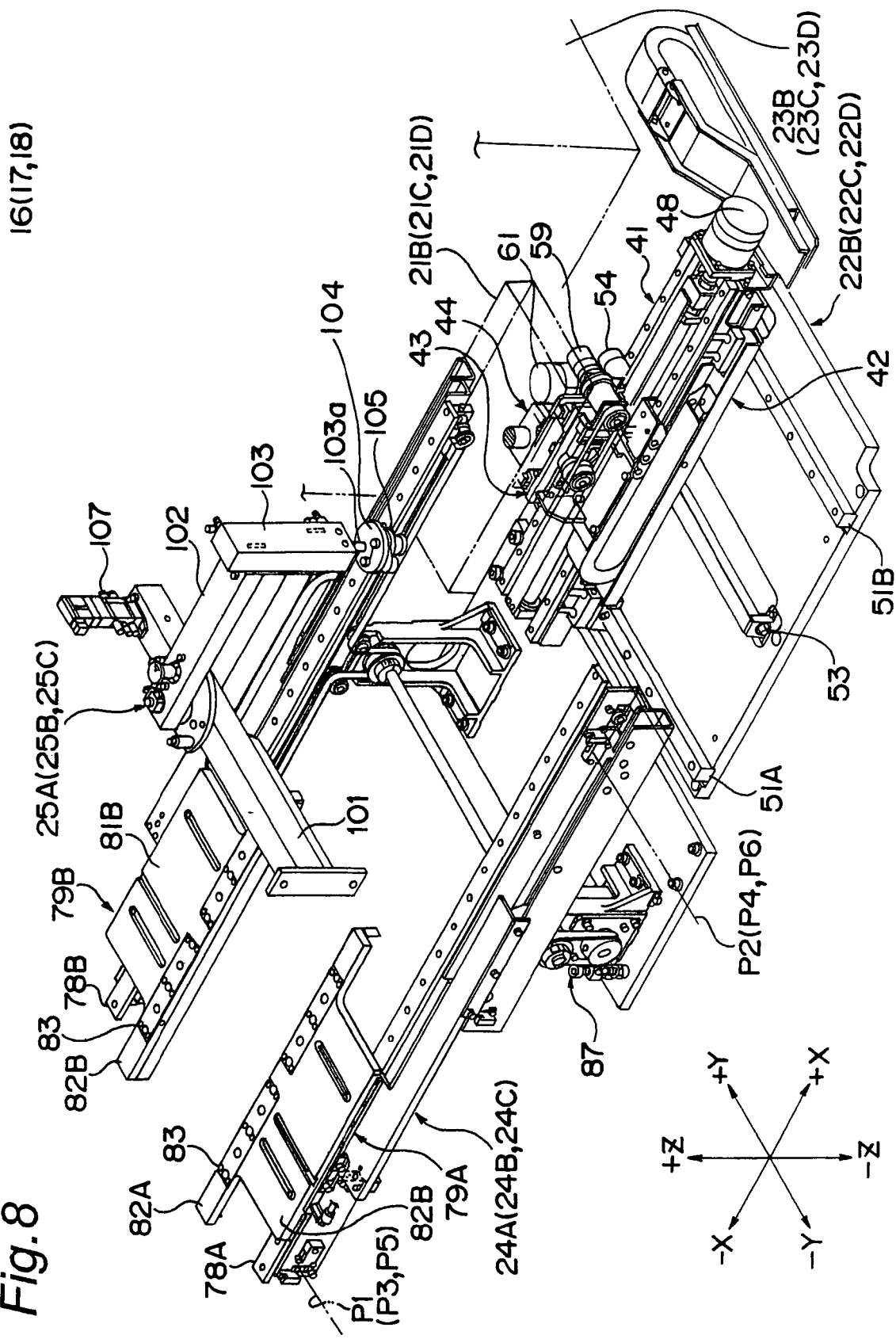
FIG. 8 is a perspective view of a pre-press bonding apparatus, first final press bonding apparatus, and second final press bonding apparatus.

The pre-press bonding apparatus 16 will be described with reference to FIGS. 1 and 2 and FIGS. 8 to 13. As shown in FIGS. 1, 2, and 8, the pre-press bonding apparatus 16 comprises a substrate stage 21B, an XYZθ table 22B, a substrate transfer apparatus 24A, a warpage correction apparatus 25A (not illustrated in FIG. 1), and an working section 23B.

Figure 10A:
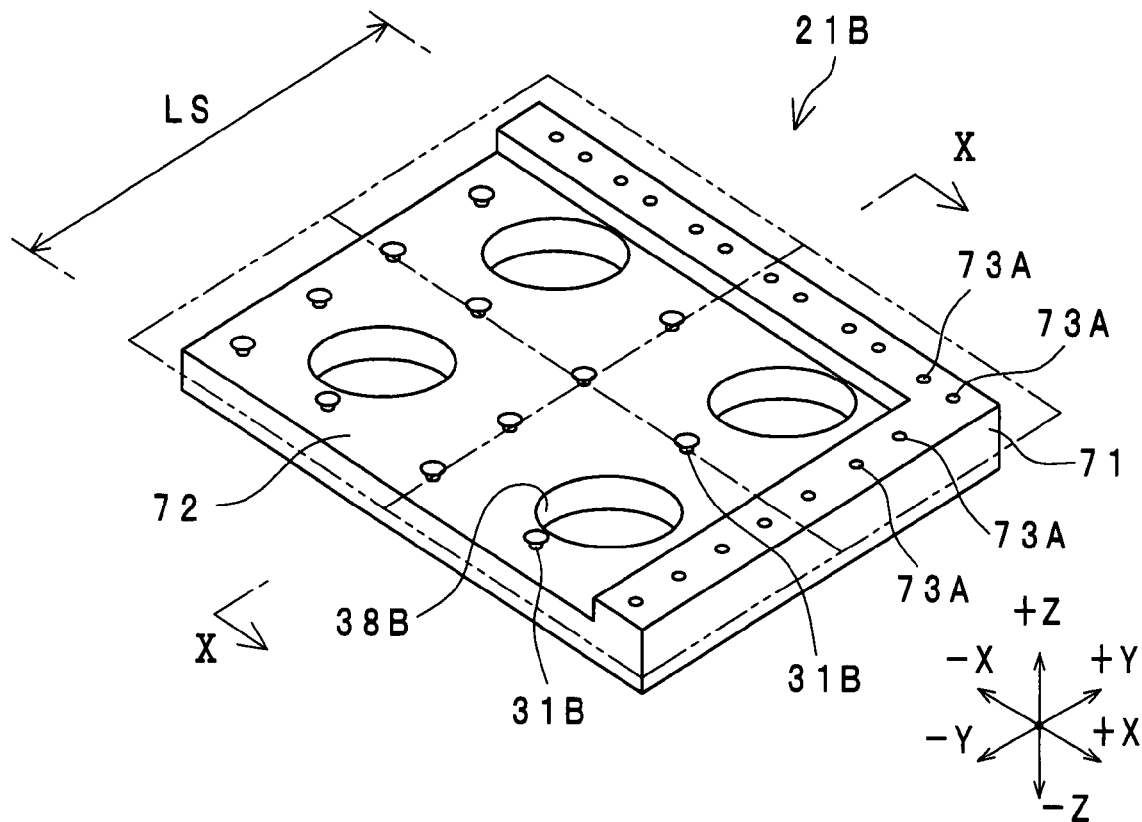
FIG. 10A is a perspective view of a substrate stage of the pre-press bonding apparatus.
Figure 10B:
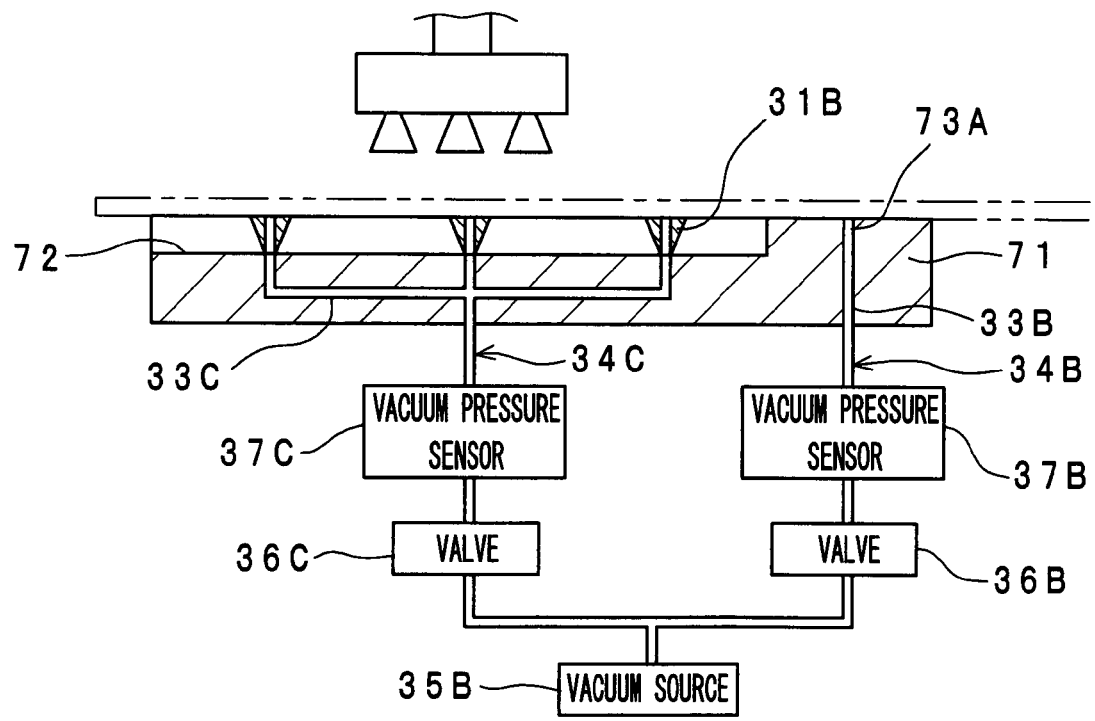
FIG. 10B is a schematic cross-sectional view along a line X-X in FIG. 10.

Referring to FIGS. 10A and 10B, the substrate stage 21B has an oblong shape smaller than the substrate 12 in plain view similarly to the substrate stage 21A, and therefore the first and second mounting regions 12a and 12b (See FIG. 3) of the substrate 12 placed on the substrate stage 21B is located outside the substrate stage 21B in plain view.

Further referring to FIGS. 10A and 10B, the substrate stage 21B comprises a rigid portion 71 on which the first and second supported portions 12c and 12d of the substrate 12, that is, portions of the lower surface sides adjacent to the first and second mounting regions 12a and 12b of the substrate 12, are disposed. The rigid portion 71 has an L-like shape in plain view. Further, the rigid portion 71 has rigidity so as not to be substantially deformed when the substrate 12 is placed thereon. The substrate stage 21B is formed with a concave portion 72 arranged so as to be opposed to a third supported portion 12e of the substrate 12, that is, the central portion of the substrate 12 spaced apart from the first and second mounting regions 12a and 12b.

A plurality of suction holes 73A are formed in the rigid portion 71. On the other hand, a plurality of flexible suction pads 31B formed with through holes disposed in the concave portion 72. Further, four circular holes 38B penetrating in the thickness direction are provided in a bottom of the concave portion 72 for lightening.

The suction holes 73A are fluidly connected to a vacuum source 35B via a suction passage 34B including an internal passage 33B formed within the substrate stage 21B. A valve 36B and vacuum pressure sensor 37B are interposed in the suction passage 34B. On the other hand, the suction pads 31B are fluidly connected to the vacuum source 35B common to the suction holes 73A via a suction passage 34C including an internal passage 33C formed within the substrate stage 21B and constituting an another line. A valve 36C and vacuum pressure sensor 37C are interposed also in the suction passage 34C. The passage 34C from the suction pad 31B to the vacuum source 35B and the suction passage 34B from the suction holes 73A to the vacuum source 35B are mutually separated.

The structure of the XYZθ table 22B is the same as that of the XYZθ table 22A of the ACF applying apparatus 15 (See FIG. 7).

Figure 11:
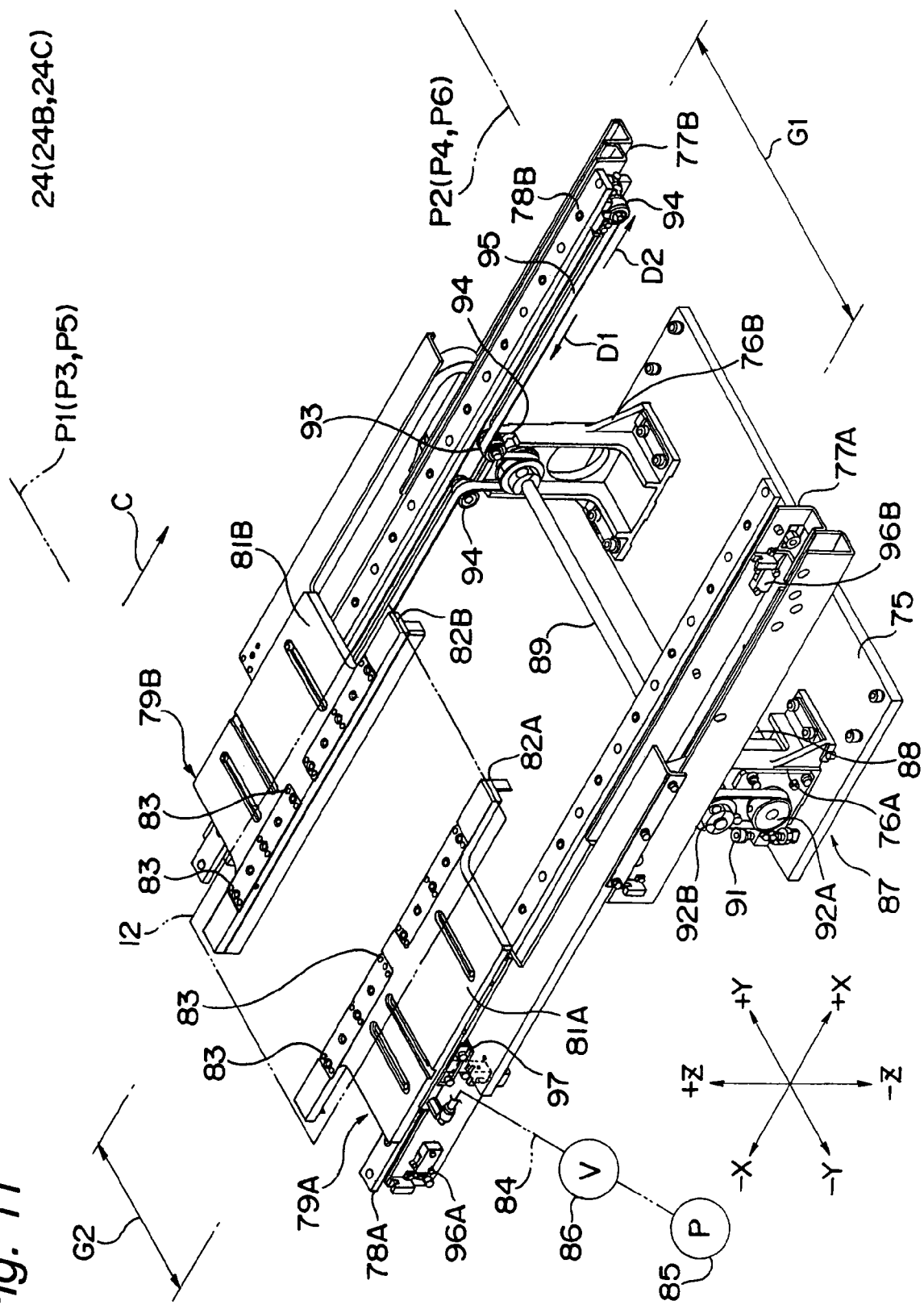
FIG. 11 is a perspective view of a substrate transfer apparatus.

The substrate transfer apparatus 24A will be described. Referring to FIG. 11, the substrate transfer apparatus 24A comprises a pair of support structures 76A and 76B fixed to a pedestal at lower ends thereof and extending in the vertical direction. These support structures 76A and 76B are opposite to each other in the Y-axis direction. The beam structures 77A and 77B extending in the X-axis direction are respectively supported by upper ends of the support structures 76A and 76B. Linear motion rails 78A and 78B are respectively secured to the beam structures 77A and 77B.

The linear motion rails 78A and 78B extend horizontally in a direction heading from the first substrate taking-over position P1 toward the second substrate taking-over position P2, that is, in the transfer direction "C". Further, these linear motion rails 78A and 78B are parallel to each other and opposed to each other with an interval G1 in the Y-axis direction, that is, in a direction orthogonal to the transfer direction "C".

The substrate transfer apparatus 24A comprises substrate holding sliders 79A and 79B capable of moving in the transfer direction "C" along the respective linear motion rails 78A and 78B. The substrate holding sliders 79A and 79B respectively comprise slider main bodies 81A and 81B movably supported by the linear motion rails 78A and 78B. Further, the substrate holding sliders 79A and 79B respectively comprise substrate placement arms 82A and 82B at leading edges of the slider main bodies 81A and 81B. The substrate placement arms 82A and 82B respectively extend in the X-axis direction (transfer direction "C"). Further, the substrate placement arms 82A and 82B are opposite to each other with an interval G2 in the Y-axis direction (a direction orthogonal to the transfer direction "C"). The interval G2 is narrower than the interval G1 between the linear motion rails 78A and 78B but larger at least than the length "LS" of the short sides of the substrate stage 21A (See FIGS. 6A and 10A) so that the substrate stages 21A and 21B can be dispose between the substrate placement arms 82A and 82B.

The structure where the substrate placement arms 82A and 82B of the substrate transfer apparatus 24A are opposed to each other with the interval G2 in the direction orthogonal to the transfer direction "C" of the substrate 12 allows rapid and efficient delivery of the substrate 12 between the substrate transfer apparatus 24A and substrate stages 21A and 21B at the first and second substrate taking-over positions P1 and P2 Specifically, when the substrate stage 21A (See FIGS. 6A and 6B) leaves or approaches the first substrate taking-over position P1, the substrate stage 21A is merely required to move in the transfer direction "C" (X-axis direction) and is not required to move in the direction orthogonal to the transfer direction "C" for the purpose of avoiding interference with the substrate placement arms 82A and 82B. Similarly, when the substrate stage 21B (See FIGS. 10A and 10B) leaves or approaches the second substrate taking-over position P2, the substrate stage 21B is merely required to move in the transfer direction "C" (X-axis direction) and is not required to move in the direction orthogonal to the transfer direction "C" for the purpose of avoiding interference with the substrate placement arms 82A and 82B. Because the substrate stages 21A and 21B can enter and exit from the substrate taking-over positions P1 and P2 merely by moving in the transfer direction C, the substrate 12 can be efficiently delivered between the substrate stages 21A and 21B and the substrate transfer apparatus 24A. Further, because the substrate stages 21A and 21B need not move in the direction orthogonal to the transfer direction "C" for taking-over of the substrate 12 at the substrate taking-over positions P1 and P2 and, dimensions of the pre-press bonding apparatus 16 and ACF applying apparatus 15 in a depth direction (the Y-axis direction) orthogonal to the transfer direction can be reduced. This results in that the dimension of the component mounting equipment 11 is reduced. The reduced dimension of the component mounting equipment 11 in the depth direction decreases the transferring time of the substrate 12 within the component mounting equipment 11 and enhances maintenanceability of the component mounting equipment 11. Especially, even if the substrate 12 has large size, the substrate 12 can be efficiently delivered and the dimension in the depth direction of the component mounting equipment 11 can be reduced. Further, the same effects are also obtained for the remaining substrate transfer apparatuses 24B and 24C.

Referring to FIG. 11, a plurality of flexible suction pads 83 are attached to the substrate placement arms 82A and 82B. These suction pads 83 are fluidly connected to a vacuum source 85 via a suction passage 84. Further, a valve 86 is interposed in the suction passage 84. A suction force by the vacuum source 85 acts on the suction pads 83 when the valve 86 is open.

One of the two sides of the substrate 12 mutually opposed in the X-axis direction is disposed on the substrate placement arm 82A while the other is placed on the substrate placement arm 82B. The substrate 12 is releasably held on the substrate placement arms 82A and 82B by the suction force of the vacuum source 85 acting on the lower surface side of the substrate 12 through the suction pads 83.

The substrate transfer apparatus 24 comprises an X axis drive mechanism 87 that reciprocatingly moves the substrate holding sliders 79A and 79B between the first and second substrate taking-over positions P1 and P2 with maintaining a relative position in the X axis direction (transfer direction "C") between the substrate holding sliders 79A and 79B. The X axis drive mechanism 87 comprises a motor 88 attached to a lower portion of the support structure 76A. Further, both ends of a drive shaft 89 are rotatably supported by the support structures 76A and 76B. The motor 88 and drive shaft 89 are linked by belts 91 and pulleys 92A and 92B. Further, secured to portions of drive shaft 89 located inside the support structures 76A and 76B are driving pulleys 93 (only the driving pulley 93 arranged at the support structure 76B is shown in FIG. 11). Further, a plurality of driven pulleys 94 are arranged on insides of the beam structures 77A and 77B and drive belts 95 are engaged to the driving pulleys 93 and driven pulleys 94 (only the driven pulley 94 and drive belt 95 at the beam structure 77B is shown in FIG. 11). Each of the slider main bodies 81A and 81B of the substrate holding sliders 79A and 79B is fixed to the drive belt 95 at a portion thereof.

The rotation of the motor 88 is transmitted to the drive belt 95 via the pulleys 92A and 92B, the belt 91, and the driving pulley 93, and therefore the drive belt 95 moves in a direction indicated by the arrow "D1" or "D2" in accordance with the rotational direction of the motor 88. When the drive belt 95 moves in the direction indicated by the arrow D1, the substrate holding sliders 79A and 79B move in the +X direction, that is, from the first substrate taking-over position P1 to the second substrate taking-over position P2. Further, when the drive belt 95 moves in the direction of the arrow D2, the substrate holding sliders 79A and 79B move in the −X direction, that is, from the second substrate taking-over position P2 toward the first substrate taking-over position P1.

Limit switches 96A and 96B are disposed on the beam structure 77A in positions corresponding to the first and second substrate taking-over positions P1 and P2. These limit switches 96A and 96B are operated by a switch operating portion 97 provided on the substrate holding slider 79A, whereby it is detected that the substrate holding sliders 79A and 79B have reached the first and second substrate taking-over positions P1 and P2.

Figure 12:
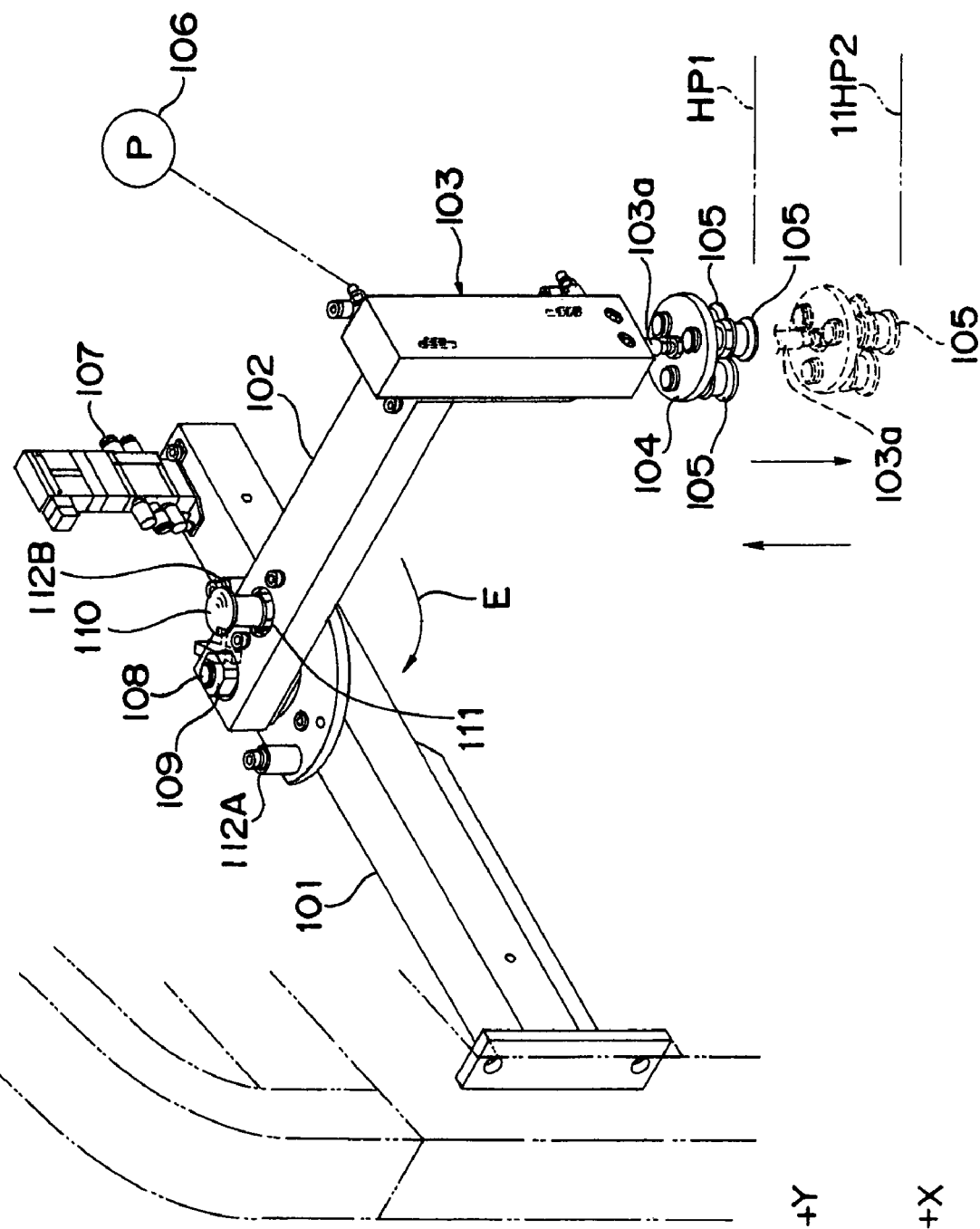
FIG. 12 is a perspective view of a warpage correction apparatus.

The warpage correction apparatus 25A will be described. Referring to FIGS. 8 and 12, at the second substrate taking-over position P2, a support beam 101 extending in the Y-axis direction is arranged above the substrate transfer apparatus 24A. Further, a support arm 102 linked to the support beam 101 at a base end thereof and an air cylinder 103 is attached to a leading end of the support beam 102. The air cylinder 103 is attached to the support arm 102 with an attitude such that a rod 103a thereof is oriented downward in vertical direction. Three elastic or flexible cushion pads 105 are attached to a bracket 104 fixed at a lower end of the rod 103a.

An air source 106 for driving the air cylinder 103 is fluidly connected to the air cylinder 103 via the valve 107. In a state where the air cylinder 103 is blocked from the air source 106 due to that the valve 107 is closed, the rod 103a of the air cylinder 103 assumes a raised position HP1 indicated by bold lines in FIG. 12. In the raised position HP1, the cushion pads 105 is opposed to the substrate transfer apparatus 24A and substrate stage 21B with an interval without contacting the substrate 12. However, when the valve 107 is closed so that the air source 106 is fluidly connected to the air cylinder 103, the rod 103a of the air cylinder 103 moves to a lower position HP2 indicated by broken lines in FIG. 12. As will be described later in detail, in the lower position HP2, the cushion pads 105 abut against the upper surface of the substrate 12 held by the substrate stage 21B and press the substrate 12 toward the substrate stage 21B.

In cases where the warpage correction apparatus 25A is not used, the air cylinder 103 can be retracted from the second substrate taking-over position P2 by turning the support arm 102 as indicated by an arrow "E". Specifically, the support arm 102 can be swung about a bolt 108 on the support beam 101 whereas the attitude of the support arm 102 shown in FIGS. 8 and 12 is maintained by tightening a nut 109. When the nut 109 is loosened and a detent 110 is pushed so as to be disengaged from the detent hole 111, the support arm 102 can be swung about the bolt. Reference numerals 112A and 112B denote control members for limiting a swing range of the support arm 102.

As will be described later, in cases where the holding force on the substrate 12 exerted by the substrate stage 21B is inefficient during delivery of the substrate 12 at the substrate taking-over position P2, the rod 103a of the air cylinder 103 falls to the lower position HP2 and thereby the cushion pads 105 press the substrate 12 to the substrate stage 21B. Therefore, the substrate 12 can be transferred to the substrate stage 21B with maintaining suitable flatness for which the warpage has been reduced, resulting in that a positional displacement of the substrate 12 during the delivery due to the warpage 12 can be prevented. As a result, the accuracy of the temporary pressure-bonding step for the substrate 12 in the working section 23B can be improved. Further, by correcting the warpage of the substrate 12, the holding force with which the substrate stage 21B holds the substrate 12 through suction rises rapidly and, therefore time necessary for delivering the substrate can be shortened, resulting in improved takt. Similar effects are also obtained for the other warpage correction apparatuses 25B and 25C.

The working section 23B comprises various mechanisms necessary for executing the pre-press bonding process for the substrate 12. Referring to FIG. 1, the working section 23B comprises a backup stage 63B for supporting the first and second mounting regions 12a and 12b of the substrate 12 at the lower surface side thereof. Further, the working section 23B comprises a tape-type component supply apparatus 115. The component 13 (See FIG. 3) is delivered from the component supply apparatus 115 by a component inversion device 116 and the delivered component 13 is transferred to the component taking-over device 117 that moves in the X-axis and Y-axis directions. The component 13 is transferred from the component taking-over device 117 to another component taking-over device 118 provided with a rotating stage, and then the pre-press bonding head 119 picks up the component 13 from the component taking-over device 118. Further, the working section 23B comprises an under camera 67B for identifying the component 13 and substrate 12.

Figure 9:
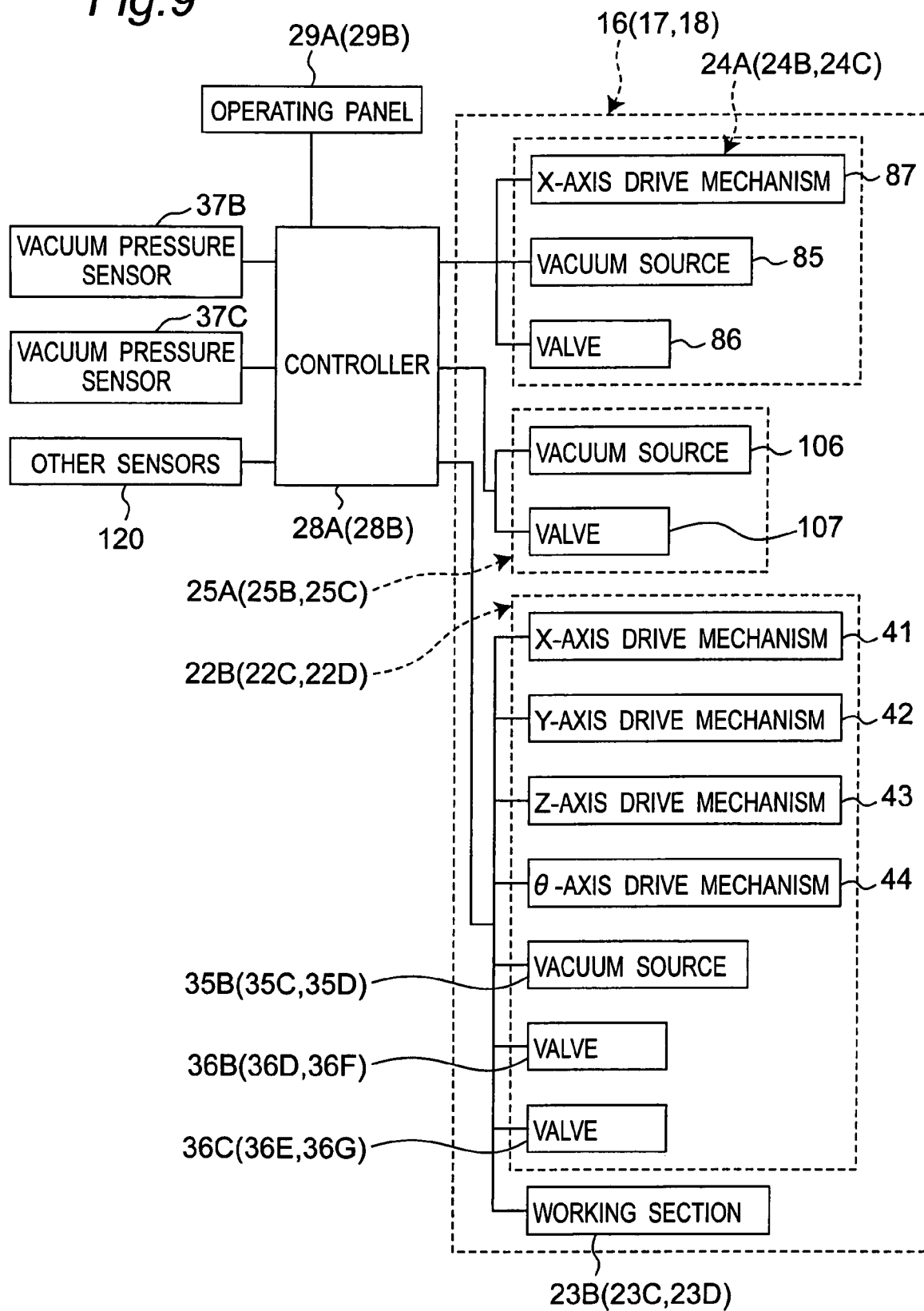
FIG. 9 is a block diagram of the pre-press bonding apparatus, first final press bonding apparatus, and second final press bonding apparatus.

Referring to FIG. 9, the controller 28A controls the operation of the XYZθ table 22B of the pre-press bonding apparatus 16, the vacuum source 35, the valves 36B and 36C, the working section 23B, the substrate transfer apparatus 24A, and the warpage correction apparatus 25A on the basis of instructions input from the operating panel 29A and the detection values by the vacuum pressure sensors 37B and 37C and the other sensors 120 (including the limit switches 96A and 96B and the under camera 67A).

The operation of the pre-press bonding apparatus 16 will be described. First, at the second substrate taking-over position P2, the substrate 12 is delivered from the substrate holding sliders 79A and 79B of the substrate transfer apparatus 24A to the substrate stage 21B. At this stage, the warpage of the substrate 12 is corrected by the warpage correction apparatus 25A if necessary. The delivery of the substrate 12 will be described later in detail.

While the substrate 12 is held by the substrate stage 21B, both the valves 36B and 36C are open. The lower surface side of the substrate 12 is placed on the rigid portion 71 at the first and second supported portions 12c and 12d adjacent to the first and second mounting regions 12a and 12b. Further, the suction force by the vacuum source 35B acts on the first and second supported portions 12c and 12d via the suction passage 34B and suction holes 73A, and therefore the lower surface sides of the first and second supported portions 12c and 12d of the substrate 12 are held by the suction force onto the rigid portion 71. Because the first and second supported portions 12c and 12d are supported by the rigid portion 71 having rigidity, the mounting regions 12a and 12b are held in a state of high flatness where the warpage has been corrected. On the other hand, the third supported portion 12e spaced apart from the first and second mounting regions 12a and 12b is placed on the suction pads 31B provided in the concave portion 72 of the substrate stage 21B. The suction force by the vacuum source 35B acts on the lower surface side of the third supported portion 12e of the substrate 12 via the suction passage 34C and suction pads 31B. Leakage does not occur because the suction pads 31B tightly contact the lower surface side of the substrate 12, and therefore the substrate is held by the suction force acting from the suction pads 31B. Further, the first and second supported portions 12c and 12d of the substrate 12 adjacent to the mounting regions 12a and 12b are pushed strongly against the rigid portion 71 of the substrate stage 21B by the strong suction force acting on the lower side of the substrate 12 from the suction pads 31B, and therefore the flatness of the mounting regions 12a and 12b is enhanced.

Thereafter, the XYZθ table 22B moves the substrate stage 21B holding the substrate 12 to the working section 23B. In the working section 23B, the pre-press bonding head 119 executes pre-press bonding of the component 13 onto the first and second mounting regions 12a and 12b of the substrate 12. For example, the first mounting region 12a of the substrate 12 is placed with alignment onto the backup stage 63B and component 13 is pre-press bonded in a predetermined position by the pre-press bonding head 119 on the basis of the identification result of the under camera 67B. Thereafter, the substrate stage 21 is rotated in the θ-axis direction by 90 degrees by the XYZθ table 22B so that the second mounting region 12b is placed in alignment on the backup stage 63B. The component 13 is similarly pre-press bonded to the second mounting region 12b.

As described above, the lower surface sides of the first and second supported portions 12c and 12d of substrate 12 adjacent to the first and second mounting regions 12a and 12b are reliably supported by the rigid portion 71 having rigidity and high flatness. Therefore, when the component is pre-press bonded in the working section 23B, the first and second mounting regions 12a and 12b are not displaced, resulting in that the component can be pre-press bonded with high positional accuracy. On the other hand, comparing with the first and second supported portions, the third supported portion 12e spaced apart from the first and second mounting regions 12a and 12b has lower necessity for high flatness in view of the pre-press bonding in the working section 23B. In this embodiment, the third supported portion 12e is reliably held not by a rigid body but instead by the suction pads 31B. Thus, the area adjacent to the first and second mounting regions 12a and 12b is held through suction by the rigid portion 71 and the area spaced apart from the first and second mounting regions 12a and 12b is held through suction by the suction pads 31B, whereby both improvement in the operational accuracy of the pre-press bonding in the working section 23B achieved by the enhanced flatness and the secure holding of the substrate 12 onto the substrate stage 21B can be achieved. Further, in cases where the holding of the substrate 12 by the substrate stage 21B is insufficient when the substrate 12 is delivered at the substrate taking-over position P2, the substrate 12 is pressed onto the substrate stage 21B by the warpage correction apparatus 25A. Therefore, the substrate 12 is reliably held by the substrate stage 21B in a state where the first and second mounting regions 12a and 12b have high flatness and there is no positional displacement due to the warpage. This also improves the accuracy of the pre-press bonding process.

Following pre-press bonding of the components onto the first and second mounting regions 12a and 12b, the XYZθ table 22B moves the substrate stage 21B holding the substrate 12 to the third substrate taking-over position P3. At the third substrate taking-over position P3, the substrate 12 is delivered from the substrate stage 21B to the substrate transfer apparatus 24B. The delivery of the substrate 12 will be described later in detail. Following the delivery of the substrate 12, the XYZθ table 22B returns the substrate stage 21B to the second substrate taking-over position P2.

The final press bonding apparatus 17 will be described with reference to FIGS. 1, 2, 8, 9, 13A, and 13B. As shown in FIGS. 1, 2, and 8, the first final press bonding apparatus 17 comprises the substrate stage 21C, the XYZθ table 22C, the substrate transfer apparatus 24B, the warpage correction apparatus 25B (not shown in FIG. 1), and the working section 23C.

Figure 13A:
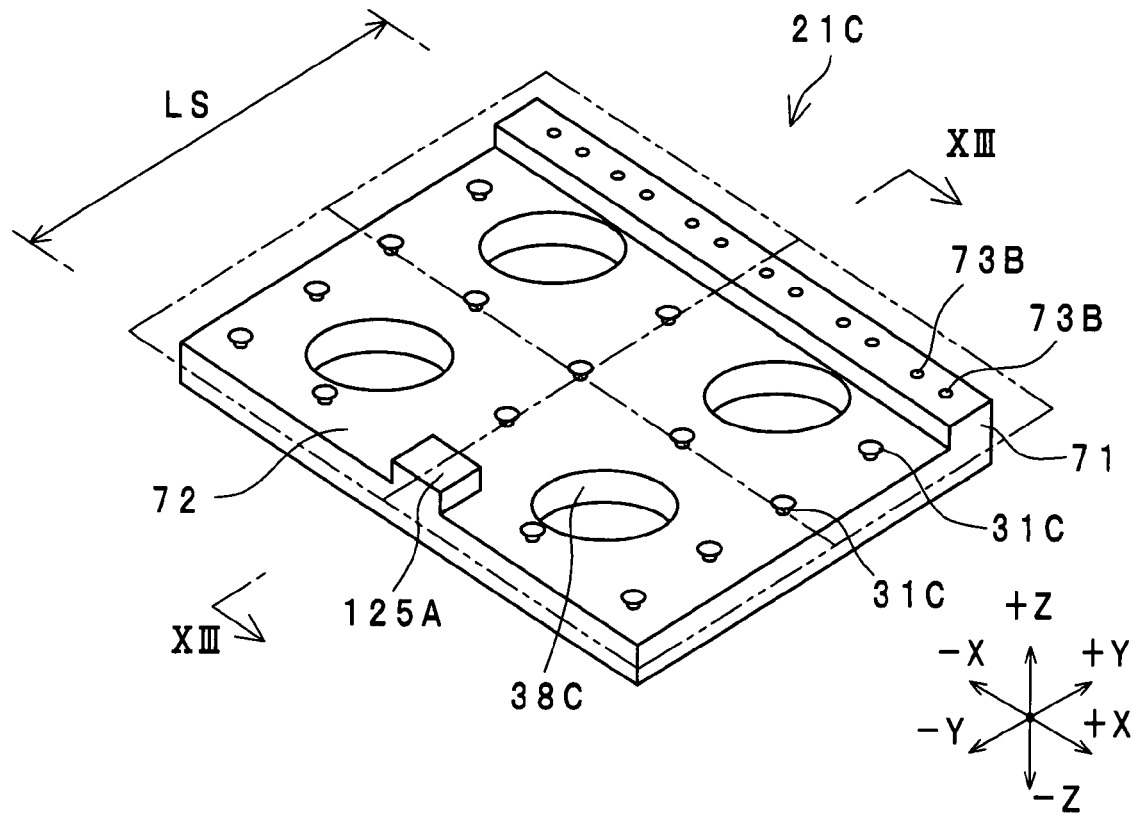
FIG. 13A is a perspective view of the substrate stage of the first final press bonding apparatus.
Figure 13B:
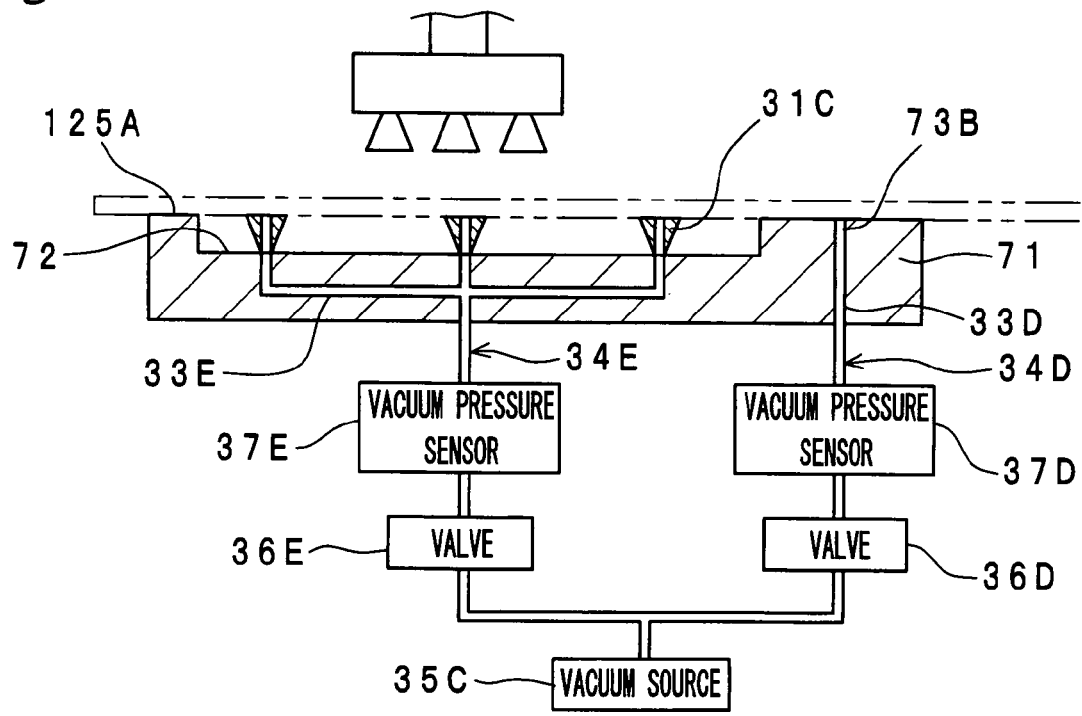
FIG. 13B is a schematic cross-sectional view along a line XIII-XIII in FIG. 13.

Referring to FIGS. 13A and 13B, the substrate stage 21C has an oblong shape smaller than that of the substrate 12 in plain view similarly to the substrate stages 21A and 21B. The first and second mounting regions 12a and 12b of the substrate 12 placed on the substrate stage 21C are located outside the substrate stage 21C in a planar perspective.

Further referring to FIGS. 13A and 13B, the substrate stage 21C comprises a rigid portion 71 of a straight band shape in plain view on which the lower surface side of the first supported portion 12c of the substrate 12, that is, the portion adjacent to first mounting region 12a of the substrate 12 is disposed. The rigid portion 71 has rigidity so as not to be substantially deformed when the substrate 12 is placed thereon. Further, the substrate stage 21C is formed with a concave portion 72 arranged so as to be opposed to remaining portion other than the first supported portion 12c of the substrate 12, that is, the second supported portion 12d and third supported portion 12e adjacent to the second mounting region 12b. A support portion 125A sufficiently shorter than the long sides of the substrate stage 21C is formed at a portion of the concave portion 72 opposed to the rigid portion 71 in plain view.

A plurality of suction holes 73B are formed in the rigid portion 71. On the other hand, a plurality of flexible suction pads 31C formed with through holes are disposed in the concave portion 72. Further, four circular holes 38C penetrating in the thickness direction are provided in a bottom of the concave portion 72 for lightening.

The suction holes 73B are fluidly connected to a vacuum source 35C via a suction passage 34D including an internal passage 33D formed within the substrate stage 21C. A valve 36D and vacuum pressure sensor 37D are interposed in the suction passage 34D. On the other hand, the suction pads 31C are fluidly connected to the vacuum source 35C common to the suction holes 73B via a suction passage 34E including an inner passage 33E formed within the substrate stage 21C and constituting an another line. A valve 36E and vacuum pressure sensor 37E are interposed also in the suction passage 34E.

The structure of the XYZθ table 22C of the first final press bonding apparatus 17 is the same as that of the XYZθ tables 22A and 22B of the ACF applying apparatus 15 and pre-press bonding apparatus 16 (See FIG. 7). Further, the structure of the substrate transfer apparatus 24B of the first final press bonding apparatus 17 is the same as that of the substrate transfer apparatus 24A of the pre-press bonding apparatus 16 (See FIG. 11). Furthermore, the structure of the warpage correction apparatus 25B of the first final press bonding apparatus 17 is the same as that of the warpage correction apparatus 25A of the pre-press bonding apparatus 16 (See FIG. 12).

The working section 23C comprises various mechanisms necessary for executing the final press bonding process to the first mounting region 12a of the substrate 12. Referring to FIG. 1, the working section 23C comprises a backup stage 63C supporting the first mounting region 12a of the substrate 12 at the lower surface side thereof. Further, the working section 23C comprises a plurality of final press bonding heads 126 for fixing the plurality of components 13 that have been pre-press bonded to the first mounting region 12a by simultaneously applying a press bonding force larger than that applied by the pre-press bonding head 119.

The controller 28B controls the operation of the XYZθ table 22C, the vacuum source 35C, the valves 36D and 36E, the working section 23C, the substrate transfer apparatus 24B, and the warpage correction apparatus 25B of the first final press bonding apparatus 17 on the basis of instructions input from the operating panel 29B and the detection values by the vacuum pressure sensors 37D and 37E and the other sensors 120 (See FIG. 9).

The operation of the first final press bonding apparatus 17 will be described. First, at the fourth substrate taking-over position P4, the substrate 12 is delivered from the substrate holding sliders 79A and 79B of the substrate transfer apparatus 24B to the substrate stage 21C. At this stage, the warpage of the substrate 12 is corrected by the warpage correction apparatus 25B if necessary. The delivery of the substrate 12 will be described latter in detail.

While the substrate 12 is held by the substrate stage 21C, both the valves 36D and 36E are open. The lower surface side of the substrate 12 is placed on the rigid portion 71 at the first supported portion 12c adjacent to the first mounting region 12a. Further, the suction force by the vacuum source 35C acts on the first supported portion 12c via the suction passage 34D and suction holes 73B, and therefore the lower surface side of the first supported portion 12c of the substrate 12 is held by the suction force onto the rigid portion 71. Because the first supported portion 12c is supported by the rigid portion 71 having rigidity, the first mounting region 12a is held in a state of high flatness where the warpage has been corrected. On the other hand, the second and third supported portions 12d and 12e spaced apart from the first mounting region 12a is placed onto the suction pads 31C provided in the concave portion 72 of the substrate stage 21. The suction force of the vacuum source 35C acts on the lower surface sides of the second and third supported portions 12d and 12e of the substrate 12 via the suction passage 34E and suction pads 31C. Leakage does not occur because the suction pads 31C tightly contact the lower surface side of the substrate 12, and therefore the substrate is reliably held by the suction force acting from the suction pads 31C. Further, the first supported portion 12c of the substrate 12 adjacent to the first mounting region 12a is pushed strongly against the rigid portion 71 of the substrate stage 21C by the strong suction force acting on the lower surface side of the substrate 12 from the suction pads 31C, and therefore the flatness of the mounting region 12a is enhanced.

As described above, the XYZθ table 22C moves the substrate stage 21C holding the substrate 12 to the working section 23C and aligns the first mounting region 12a with the working section 23C. In the working section 23C, the final press bonding head 126 finally press bonds the component 13 onto the first mounting region 12a of the substrate 12.

As described above, the lower side of the first supported portion 12c of the substrate 12 adjacent to the first mounting region 12a is reliably supported by the rigid portion 71 having rigidity and high flatness. Therefore, when the component 13 is final press bonded in the working section 23C, displacement of component 13 as a result of displacement of the first mounting region 12a is not occurred, resulting in that the component 13 can be final press bonded to the first mounting region 12a with high accuracy. On the other hand, the second and third supported portions 12d and 12e spaced apart from the first mounting region 12a are reliably held not by the rigid portion but by the suction pads 31C. Thus, the area adjacent to the first mounting region 12a is held through suction by the rigid portion 71 whereas the portion spaced apart from the first mounting region 12a is held through suction by the suction pads 31E, whereby both improvement in the operational accuracy of the final press bonding process to the first mounting region 12a in the working section 23C achieved by the enhanced flatness and the secure holding of the substrate 12 onto the substrate stage 21C can be achieved. Further, in cases where the holding of the substrate 12 by the substrate stage 21C is insufficient when the substrate 12 is delivered at the substrate taking-over position P4, the substrate 12 is pressed onto the substrate stage 21B by the warpage correction apparatus 25B. Therefore, the substrate 12 is reliably held by the substrate stage 21C in a state where the first mounting region 12a has high flatness and there is no positional displacement due to warpage. This also improves the accuracy of the final press bonding process.

Following final press bonding of the component 13 onto the first mounting region 12a, the XYZθ table 22C moves the substrate stage 21C holding the substrate 12 to the fifth substrate taking-over position P5. At the fifth substrate taking-over position P5, the substrate 12 is delivered from the substrate stage 21C to the substrate transfer apparatus 24C. The delivery of the substrate 12 will be described later in detail. Following the delivery of the substrate 12, the XYZθ table 22C returns the substrate stage 21C to the fourth substrate taking-over position P4.

The second final press bonding apparatus 18 will be described with reference to FIGS. 1, 2, 8, 9, 14A and 14B. As shown in FIGS. 1, 2 and 8, the second final press bonding apparatus 18 comprises the substrate stage 21D, the XYZθ table 22D, the substrate transfer apparatus 24C, the warpage correction apparatus 25C (not shown in FIG. 1), and the working section 23D.

Figure 14A:
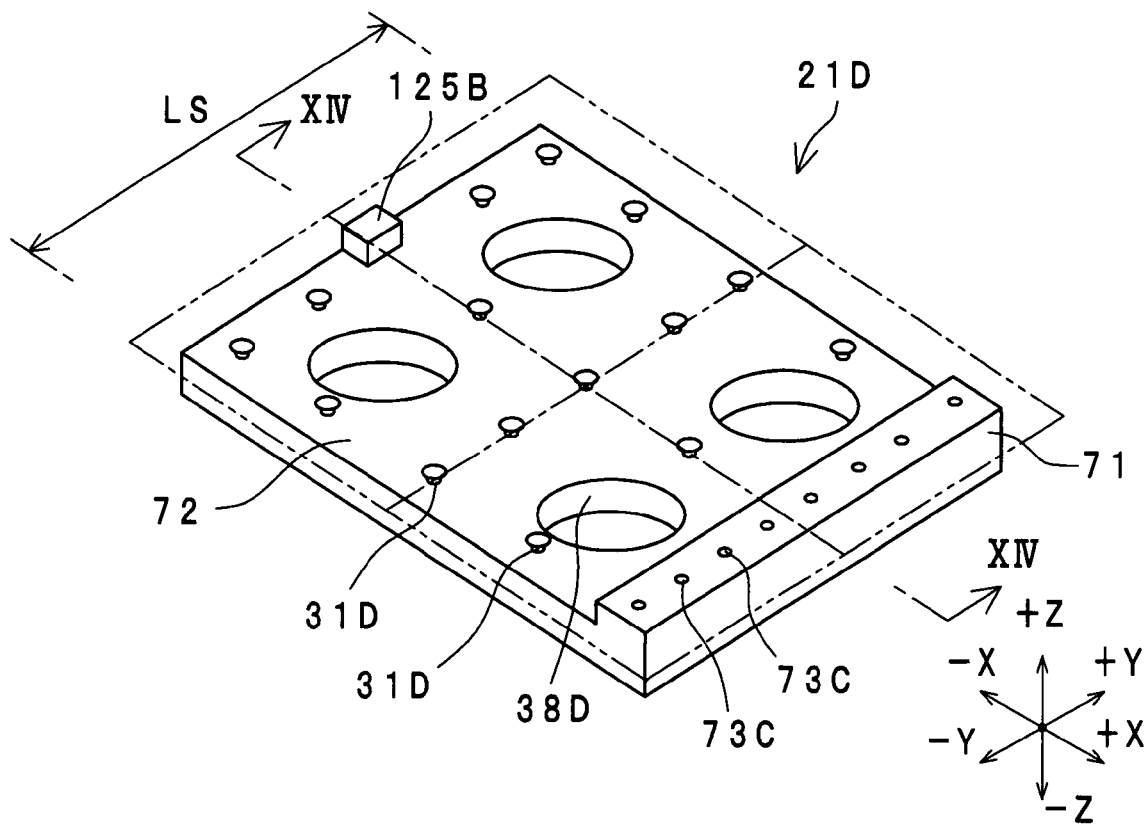
FIG. 14A is a perspective view of the substrate stage of the second final press bonding apparatus.
Figure 14B:
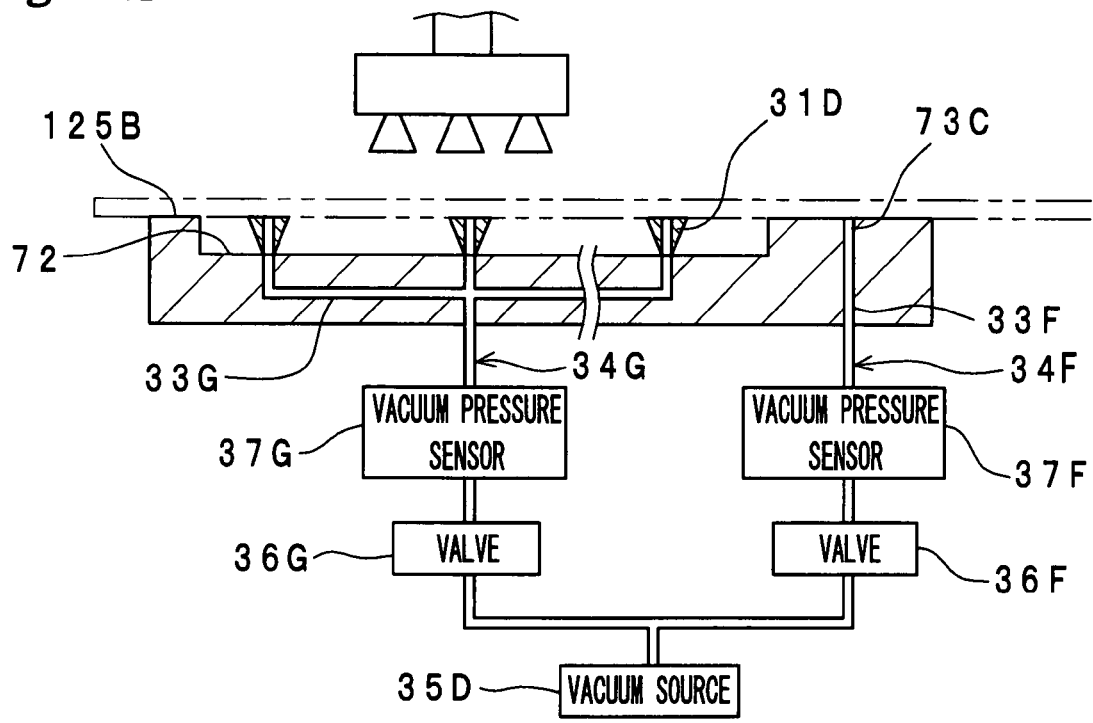
FIG. 14B is a schematic cross-sectional view along a line XIV-XIV in FIG. 14.

Referring to FIGS. 14A and 14B, the substrate stage 21D has an oblong shape smaller than the substrate 12 in plain view similarly to the substrate stages 21A, 21B, and 21C, and therefore the first and second mounting regions 12a and 12b of the substrate 12 placed on the substrate stage 21C is located outside the substrate stage 21C in plain view.

Further referring to FIGS. 14A and 14B, the substrate stage 21D comprises a rigid portion 71 of a straight band shape in plain view on which the lower surface side of the second supported portion 12d of the substrate 12, that is, the portion adjacent to the second mounting region 12b of the substrate 12 is disposed. The rigid portion 71 has rigidity so as not to be substantially deformed when the substrate 12 is placed thereon. Further, the substrate stage 21D is formed with a concave portion 72 so as to be opposed to remaining portion other than the second supported portion 12d of the substrate 12, that is, the first supported portion 12c and third supported portion 12e adjacent to the first mounting region 12a. A support portion 125B sufficiently shorter than the short sides of the substrate stage 21C is formed at a portion of the concave portion 72 opposed to the rigid portion 71 in plain view.

A plurality of suction holes 73C are formed in the rigid portion 71. On the other hand, a plurality of flexible suction pads 31D formed with through holes are disposed in the concave portion 72. Further, four circular holes 38D penetrating in the thickness direction are provided in a bottom of the concave portion 72 for lightening.

The suction holes 73C are fluidly connected to a vacuum source 35D via a suction passage 34F including an internal passage 33F formed within the substrate stage 21D. A valve 36F and vacuum pressure sensor 37F are interposed in the suction passage 34F. On the other hand, the suction pads 31D are fluidly connected to the vacuum source 35D common to the suction holes 73C via a suction passage 34G including an internal passage 33G formed within the substrate stage 21D and constituting an another line. A valve 36G and vacuum pressure sensor 37G are also interposed in the suction passage 34G.

The structure of the XYZθ table 22D of the second final press bonding apparatus 18 is the same as that of the XYZθ tables 22A to 22C of the ACF applying apparatus 15, pre-press bonding apparatus 16, and first final press bonding apparatus 17 (See FIG. 7). Further, the structure of the substrate transfer apparatus 24C of the first final press bonding apparatus 17 is the same as that of the substrate transfer apparatuses 24A and 24B of the pre-press bonding apparatus 16 and first final press bonding apparatus 17 (See FIG. 11). Furthermore, the structure of the warpage correction apparatus 25C of the second final press bonding apparatus 18 is the same as that of the warpage correction apparatuses 25A and 25B of the pre-press bonding apparatus 16 and first final press bonding apparatus 17 (See FIG. 12).

The working section 23D comprises various mechanisms necessary for executing the final press bonding process to the second mounting region 12b of the substrate 12. Referring to FIG. 1, the working section 23D comprises a backup stage 63D supporting the second mounting region 12b of the substrate 12 at the lower surface side thereof. Further, the working section 23D comprises a plurality of final press bonding heads 127 for fixing the plurality of components 13 that have been pre-press bonded to the second mounting region 12b by simultaneously applying a press bonding force larger than that applied by the pre-press bonding head 119.

The controller 28B controls the operation of the XYZθ table 22D, the vacuum source 35D, the valves 36F and 36G, the working section 23D, the substrate transfer apparatus 24C, and the warpage correction apparatus 25C of the second final press bonding apparatus 18 on the basis of instructions input from the operating panel 29B and the detection values by the vacuum pressure sensors 37F and 37G and the other sensor 120 (See FIG. 9).

The operation of the second final press bonding apparatus 18 will be described. First, at the sixth substrate taking-over position P6, the substrate 12 is delivered from the substrate holding sliders 79A and 79B of the substrate transfer apparatus 24C to the substrate stage 21D. At this stage, the warpage of the substrate 12 is corrected by the warpage correction apparatus 25C if necessary. The delivery of the substrate 12 will be described latter in detail.

While the substrate 12 is held by the substrate stage 21D, both the valves 36F and 36G are open. The lower surface side of the substrate 12 is placed on the rigid portion 71 at the second supported portion 12d adjacent to the second mounting region 12b. Further, the suction force by the vacuum source 35D acts on the second supported portion 12d via the suction passage 34F and suction holes 73C, and therefore the lower surface side of the second supported portion 12d of the substrate 12 is held by the suction onto the rigid portion 71. Because the second supported portion 12d is supported by the rigid portion 71 having rigidity, the second mounting region 12b is held in a state of high flatness where the warpage has been corrected. On the other hand, the first and third supported portions 12c and 12e spaced apart from the second mounting region 12b is placed onto the suction pads 31G provided in the concave portion 72 of the substrate stage 21. The suction force of the vacuum source 35D acts on the lower surface sides of the first and third supported portions 12c and 12e of the substrate 12 via the suction passage 34G and suction pads 31D. Leakage does not occur because the suction pads 31D closely contact the lower surface side of the substrate 12, and therefore the substrate is reliably held by the suction force acting from the suction pads 31D. Further, the second supported portion 12d of the substrate 12 adjacent to the second mounting region 12b is pushed strongly against the rigid portion 71 of the substrate stage 21D by the strong suction force acting on the lower surface side of the substrate 12 from the suction pads 31D, and therefore the flatness of the mounting region 12b is enhanced.

Thereafter, the XYZθ table 22D moves the substrate stage 21D holding the substrate 12 to the working section 23D and aligns the second mounting region 12b with the working section 23D. In the working section 23D, the final press bonding head 127 finally press bonds the component 13 onto the second mounting region 12b of the substrate 12.

As described above, the lower side of the second supported portion 12d of the substrate 12 adjacent to the second mounting region 12b is reliably supported by the rigid portion 71 having rigidity and high flatness. Therefore, when component 13 is final press bonded in the working section 23D, displacement of component 13 as a result of displacement of the second mounting region 12b is not occurred, resulting in that the component 13 can be final press bonded to the second mounting region 12b with high accurately. On the other hand, the first and third supported portions 12c and 12e spaced apart from the second mounting region 12b are reliably held not by the rigid body but by the suction pads 31D, resulting in that the warpage of the substrate 12 is corrected to increase the flatness. Thus, the area adjacent to the second mounting region 12b is held through suction by the rigid portion 71 whereas the portion spaced apart from the second mounting region 12b is held through suction by the suction pads 31E, whereby both improvement in the operational accuracy of the final press bonding process to the second mounting region 12b in the working section 23D achieved by the enhanced flatness and the secure holding of the substrate 12 onto the substrate stage 21D can be achieved. Further, in cases where the holding of the substrate 12 by the substrate stage 21D is insufficient when the substrate 12 is delivered at the substrate taking-over position P6, the substrate 12 is pressed onto the substrate stage 21D by warpage correction apparatus 25C. Therefore, the substrate 12 is reliably held by the substrate stage 21D in a state where the second mounting region 12b has a high flatness and there is no positional displacement due to warpage. This also improves the accuracy of the final press bonding process.

Following final press bonding of the component 13 onto the second mounting region 12b, the XYZθ table 22D moves the substrate stage 21D holding the substrate 12 to the substrate taking-over position for the unloader 27. The substrate 12 is delivered from the substrate stage 21D to the unloader 27 and transferred outside the component mounting equipment 11. Following the delivery of the substrate 12, the XYZθ table 22D returns the substrate stage 21D to the sixth substrate taking-over position P6.

Figure 15:
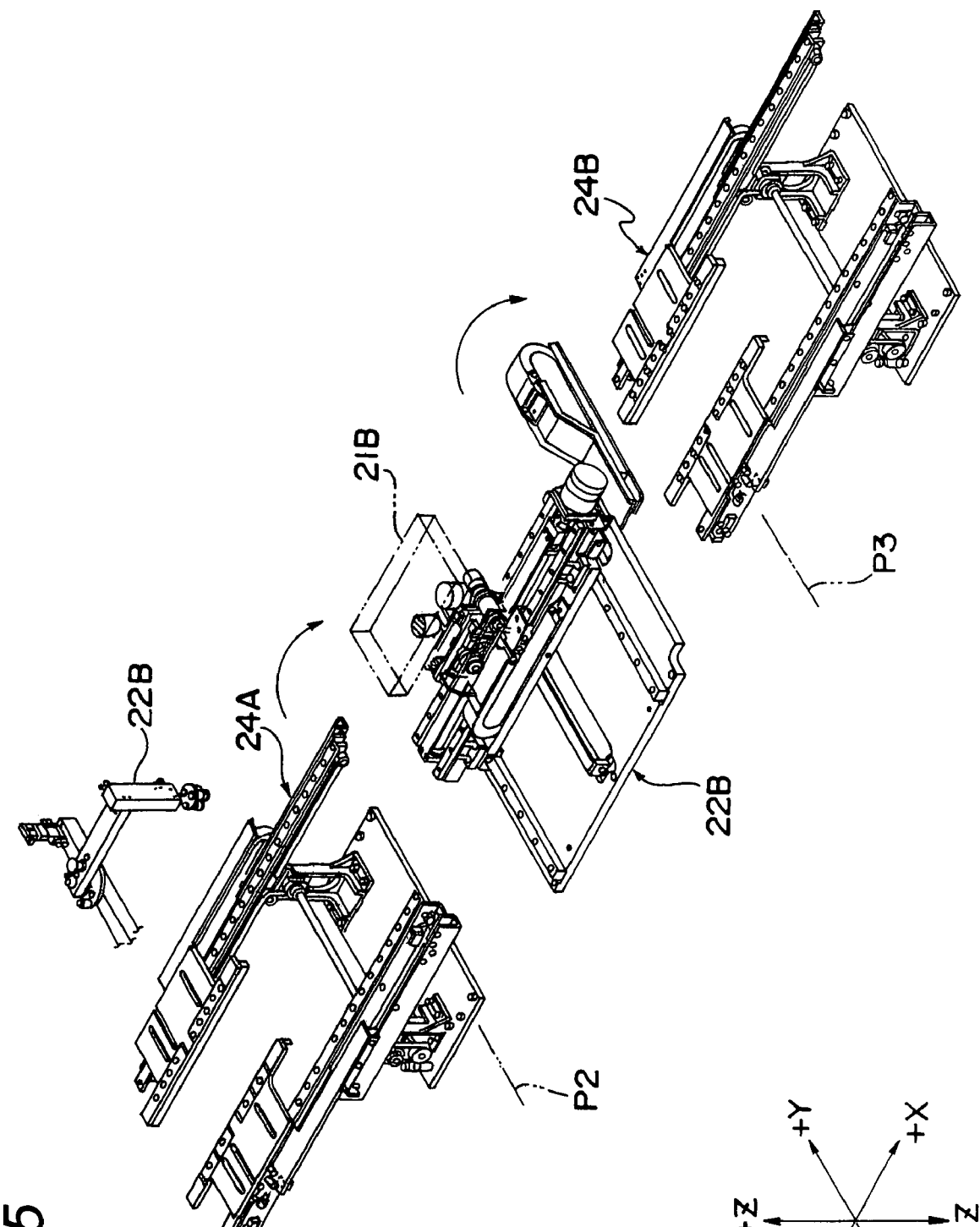
FIG. 15 is an exploded perspective view of the substrate stage of the pre-press bonding apparatus as well as two transferring apparatuses disposed upstream and downstream thereto.

Then, the delivery of the substrate 12 between the substrate transfer apparatuses 24A to 24C and the substrate stages 21A to 21D will be described. Referring to FIG. 15, substrate 12 is delivered from the substrate transfer apparatus 24A to the substrate stage 21B of the pre-press bonding apparatus 16 at the substrate taking-over position P2. Further, the substrate 12 held on the substrate stage 21B is delivered to the substrate transfer apparatus 24B at the substrate taking-over position P3. The procedures for delivering the substrate 12 from the substrate transfer apparatuses 21B and 21C to the substrate stages 21C and 21D of the first and second final press bonding apparatuses 17 and 18 at the fourth and sixth substrate taking-over positions P4 and P6 are the same as that at the substrate taking-over position P2. Further, the procedures for delivering the substrate 12 from the substrate stages 21A and 21C of the ACF applying apparatus 15 and first final press bonding apparatus 17 to the substrate transfer apparatuses 24A and 24C at the first substrate taking-over position P1 and fifth substrate taking-over position P5 are also the same as that at the substrate taking-over position P3. Therefore, the procedures for delivering the substrate 12 at the second substrate taking-over position P2 and third substrate taking-over position P3 will be described.

First, the delivering of the substrate 12 from the substrate transfer apparatus 24A to the substrate stage 21B of the pre-press bonding apparatus 16 at the second substrate taking-over position P2 will be described. In the following description a flowchart of FIG. 16 and the schematic diagrams of FIGS. 17A to 17H are mainly referred to. Further, for the elements not illustrated in FIGS. 17A to 17H, reference is made to FIG. 3 and FIGS. 7 to 12.

Figure 17A:
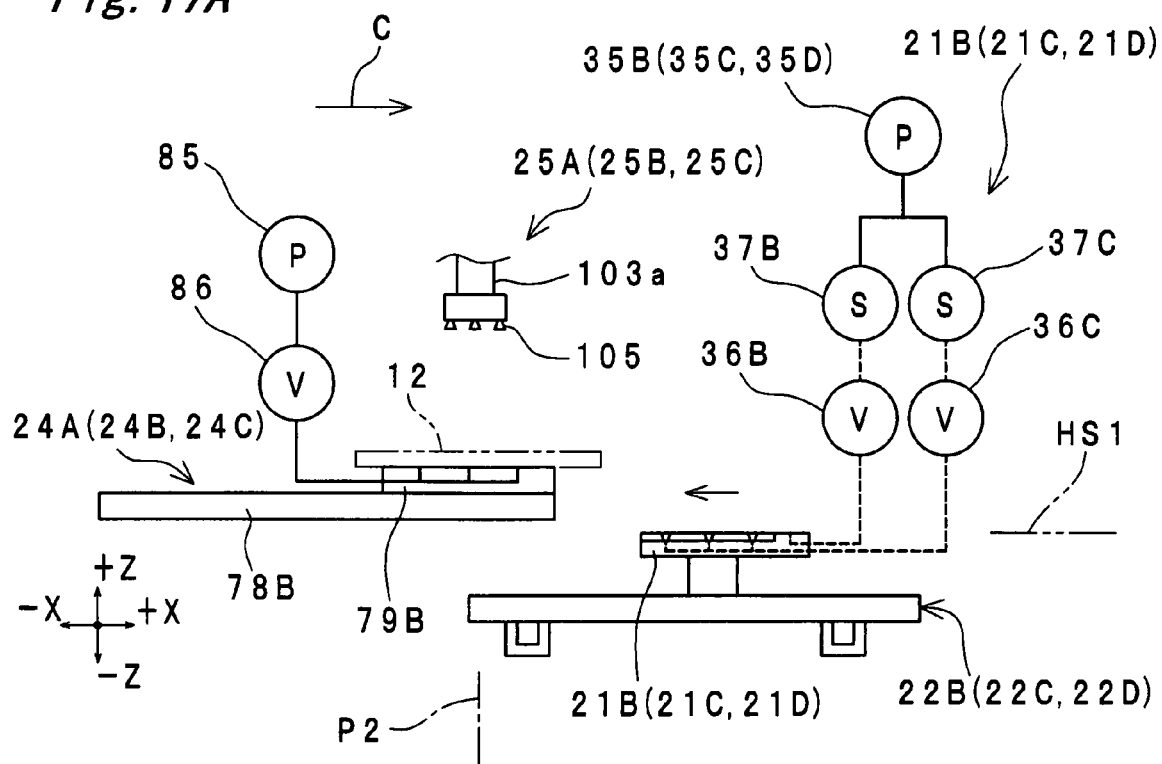
FIG. 17A is a schematic side view of the procedure for moving the substrate from the substrate transfer apparatus to the panel stage.

As shown in FIG. 17A, the substrate holding sliders 79A and 79B of the substrate transfer apparatus 24A holding the substrate 12 move to the second substrate taking-over position P2. Due to that the valve 86 is open, the substrate 12 is held on the substrate placement arms 82A and 82B of the substrate holding sliders 79A and 79B by the suction force acting on the suction pads 83 from the vacuum source 85. On the other hand, the upper surface of the substrate stage 21B is located at a height position HS1 below the lower surface of the substrate 12 held by the substrate holding sliders 79A and 79B. Further, the valve 86 is opened.

Figure 16:
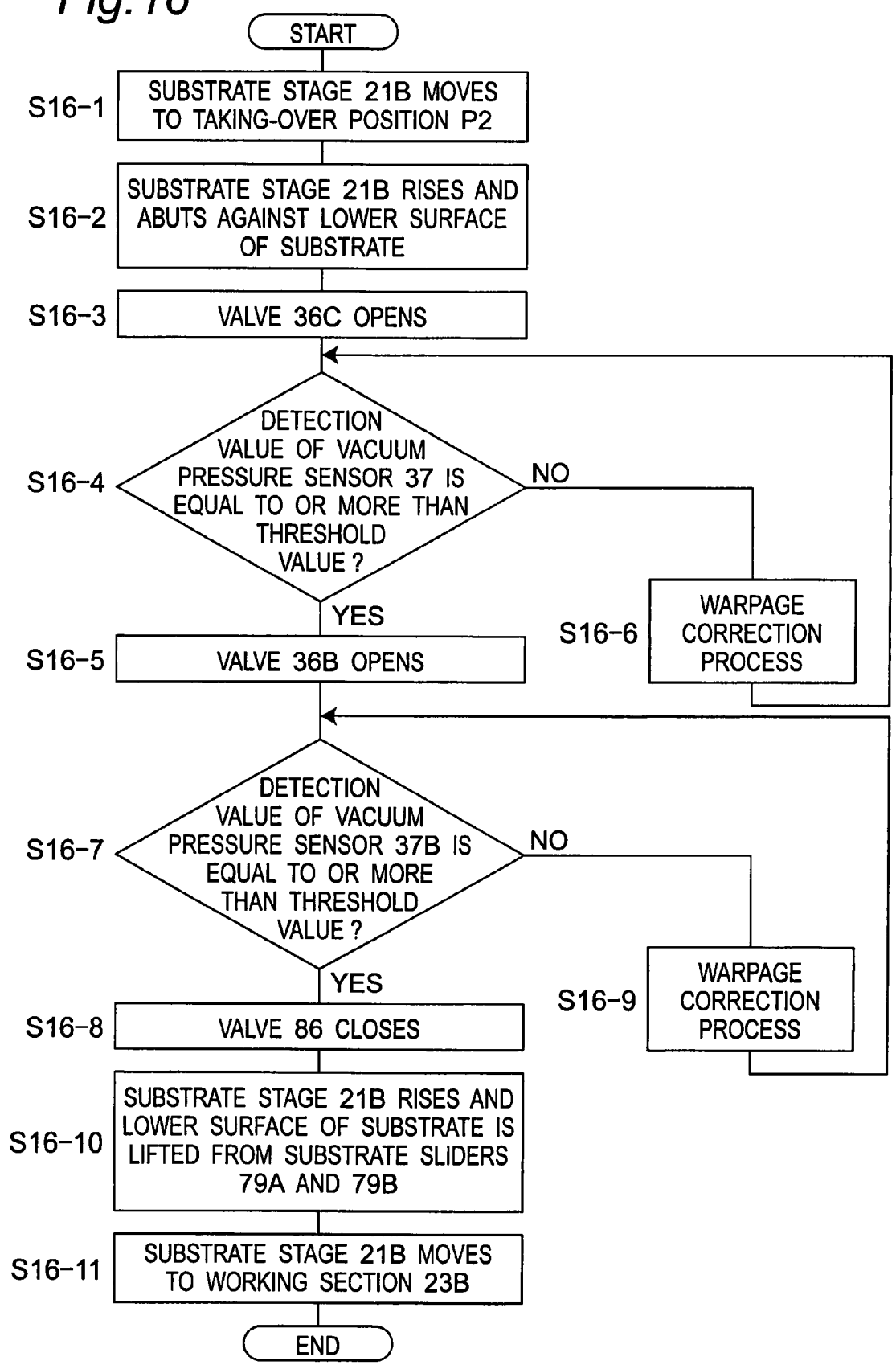
FIG. 16 is a flowchart for illustrating a procedure for moving the substrate from the substrate transfer apparatus to the panel stage.
Figure 17B:
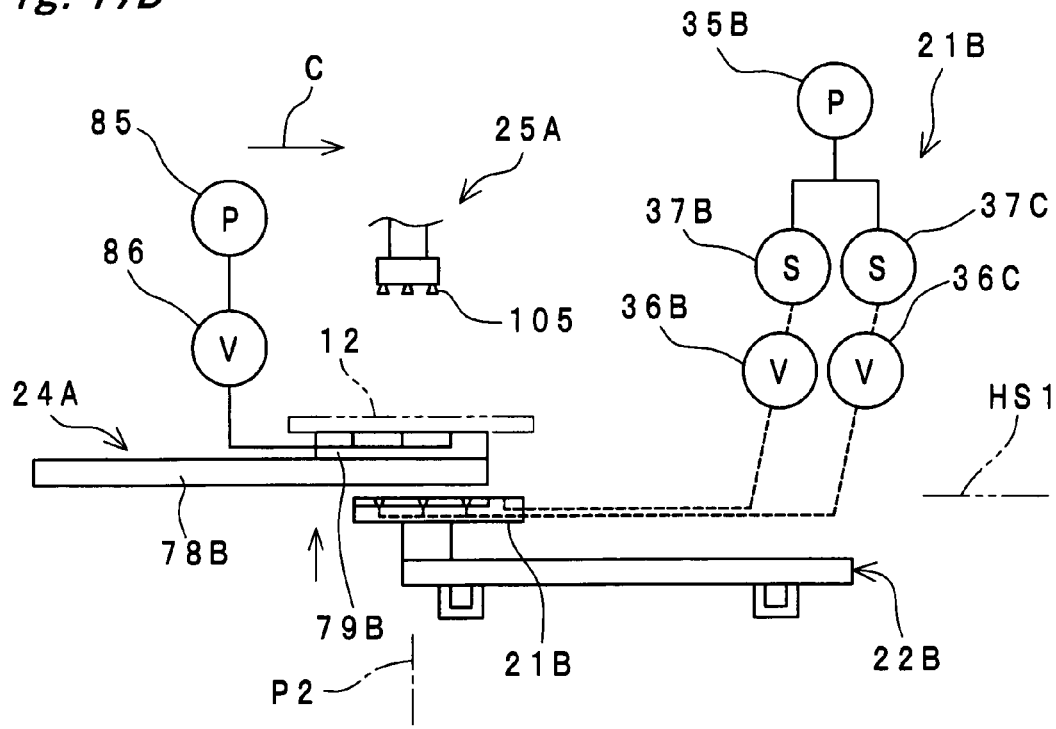
FIG. 17B is a schematic side view of the procedure for moving the substrate from the substrate transfer apparatus to the panel stage.

At step S16-1 of FIG. 16, the substrate stage 21B moves in the −X direction toward the second substrate taking-over position P2. As shown in FIG. 17B, the substrate stage 21B moves to the interval G2 between the substrate holding sliders 79A and 79B. As a result, the substrate stage 21B is located below the substrate 12 held by the substrate holding sliders 79A and 79B.

The substrate stage 21B can approach or move to the interval G2 between the substrate holding sliders 79A and 79B merely by moving in the −X direction along the transfer direction "C". In other words, the substrate stage 21B need not move in the direction orthogonal to the transfer direction "C" (Y-axis direction) in order to avoid interference with the substrate holding sliders 79A and 79B. Accordingly, the delivery of the substrate 12 in the second substrate taking-over position P2 can be efficiently performed. Further, because the substrate stage 21B need not move in the direction orthogonal to the transfer direction "C" in order to deliver the substrate 12, the dimension of the pre-press bonding apparatus 16 in the direction orthogonal to the transfer direction "C" can be reduced.

Figure 17C:
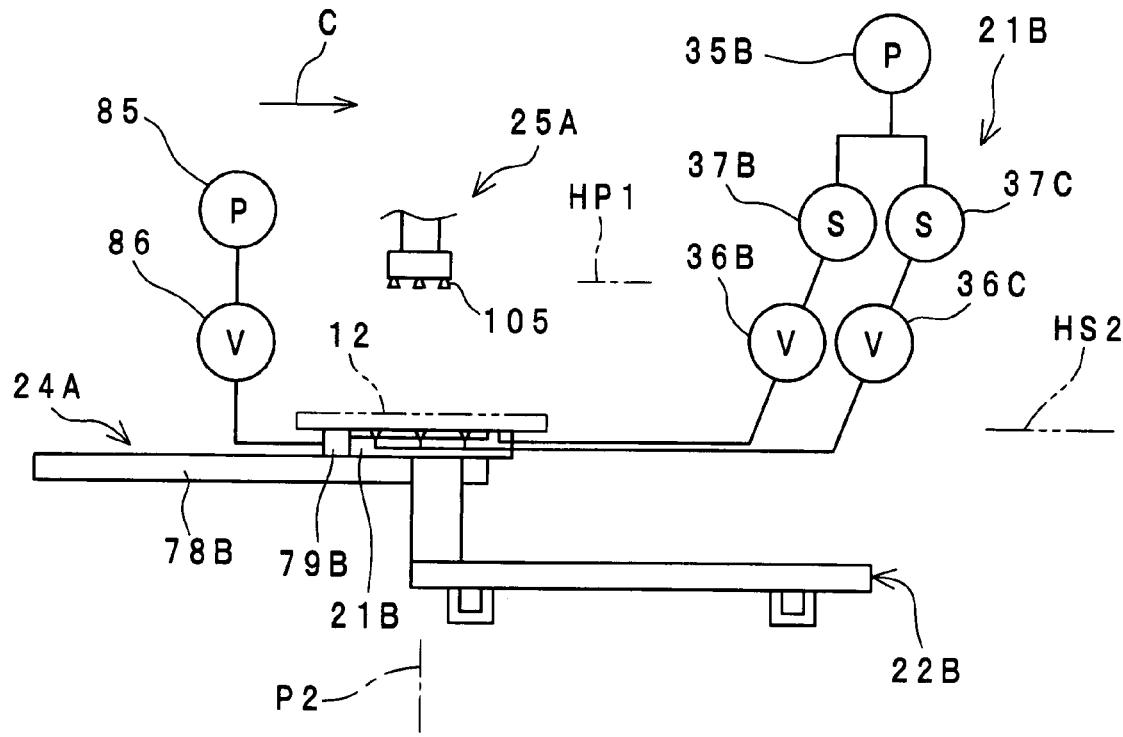
FIG. 17C is a schematic side view of the procedure for moving the substrate from the substrate transfer apparatus to the panel stage.

Thereafter, at step S16-2, the substrate stage 21B rises. As shown in FIGS. 17B and 17C, the substrate stage 21B rises to a height position HS2 at which the upper surface thereof abuts against the lower surface of the substrate 12 held by the substrate holding sliders 79A and 79B.

After the upper surface of the substrate stage 21B abuts against the lower surface of the substrate 12, the valve 36C interposed between the suction pads 31B of the substrate stage 21B and the vacuum source 35B is opened at step S16-3. As a result, the third supported portion 12e of the substrate 12 (the portion spaced apart from the first and second mounting regions 12a and 12b) is held by the suction force of the vacuum source 35B acting via the suction pads 31B onto the substrate stage 21B. The suction pads 31B tightly contact the lower surface of the substrate 12 and, therefore the lower surface side of the third supported portion 12e of the substrate 12 is reliably held by the substrate stage 21B. Further, the warpage is corrected as a result of the first and second supported portions 12c and 12d being pushed strongly against the rigid portion 71.

Thereafter, at step S16-4, the detection value by the vacuum pressure sensor 37C interposed between the vacuum source 35B and suction pads 31B are compared with a predetermined threshold value. If the detection value of the vacuum pressure sensor 37C is equal to or more than the threshold value, that is, if the holding force acting on the substrate 12 by the suction pads 31B is sufficient, then the processing moves on to step S16-5.

At step S16-5, the valve 36B interposed between the suction holes 73A and the vacuum source 35B provided in the rigid portion 71 of the substrate stage 21B is opened. As a result, the first and second supported portions 12c and 12d of the substrate 12 (adjacent to the first and second mounting regions 12a and 12b) are held on the substrate stage 21B by the suction force of vacuum source 35B acting via the suction holes 73A. The lower surface side of the first and second supported portions 12c and 12d of the substrate 12 are reliably supported by the rigid portion, and therefore the first and second mounting regions 12a and 12b are held in a state of high flatness in which the warpage has been corrected.

Due to that the suction by the suction holes 73A in the rigid portion 71 is started at step S16-5 after the suction by the suction pads 31B has been started at step S16-4, the substrate 12 can be more suitably held onto the substrate stage 21B. Specifically, when the substrate 12 is strongly sucked by the suction pads 31B via which an air leakage is not readily produced, the first and second supported portions 12c and 12d adjacent to the first and second mounting regions 12a and 12b are pushed against the upper surface of the rigid portion 71. By stating suction by the suction holes 73A in this condition, the air leakage at the suction holes 73A can be prevented, resulting in that the lower surface side of the first and second supported portions 12c and 12d can be reliably held onto the rigid portion 71.

At step S16-7, the detection value of the vacuum pressure sensor 37B interposed between the vacuum source 35B and suction holes 73B is compared with a predetermined threshold. If the detection values of the vacuum pressure sensor 37B is equal to or more than the threshold, that is, if the holding force by the suction holes 71 acting on the substrate 12 is sufficient, the processing moves to step S16-8.

At step S16-8, the valve 86 is closed. As a result, the holding of the substrate 12 by the substrate holding sliders 79A and 79B of the substrate transfer apparatus 24A is released. As a result of the operation of the valves 36B, 36C, and 86 in steps S16-3, S16-5, and S16-8, there occurs switching from a state where the substrate 12 is held by the substrate holding sliders 79A and 79B of the substrate transfer apparatus 24A to a state where the substrate 12 is held by the substrate stage 21B.

If the detection value of the vacuum pressure sensor 37C is less than the threshold at step S16-4, that is, if the holding force acting on the substrate 12 by the suction pads 31B is inefficient, the warpage correction process to the substrate 12 by the warpage correction apparatus 25A is executed at step S16-6. Similarly, if the detection value of the vacuum pressure sensor 37B is less than the threshold value at step S16-7, that is, if the holding force acting on the substrate 12 by the suction holes 73A of the rigid portion 71 is insufficient, the warpage correction process is executed at step S16-9.

Figure 17D:
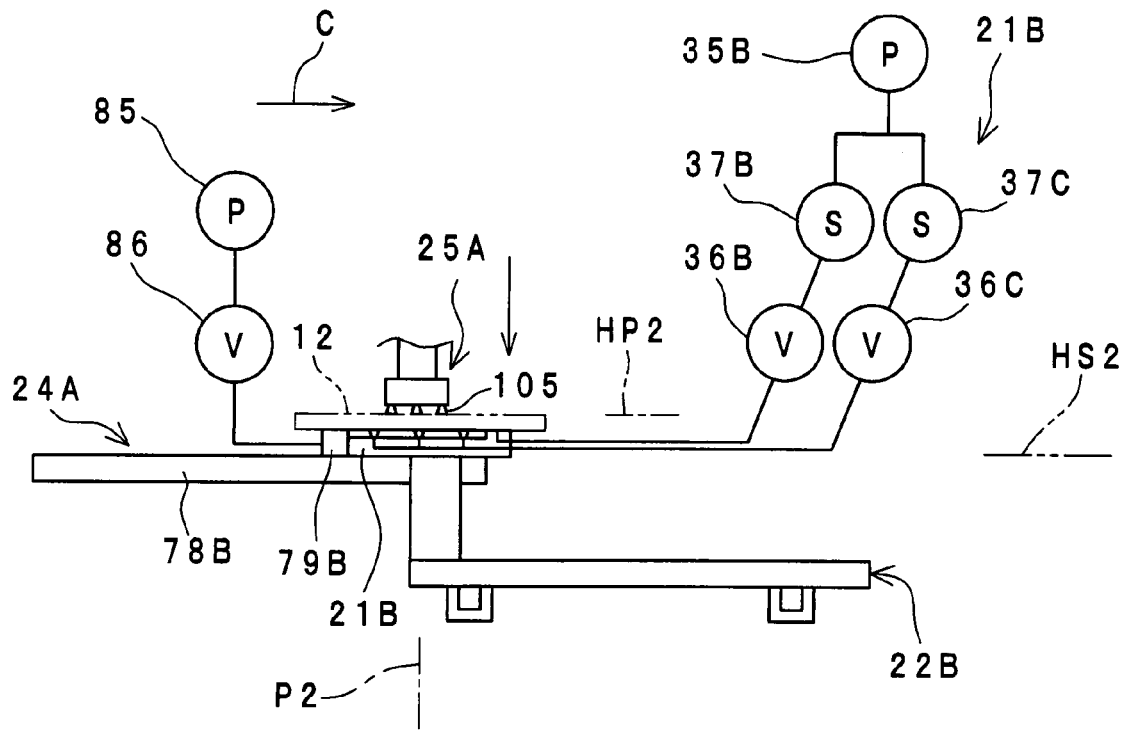
FIG. 17D is a schematic side view of a procedure for moving the substrate from the substrate transfer apparatus to the panel stage.
Figure 17E:
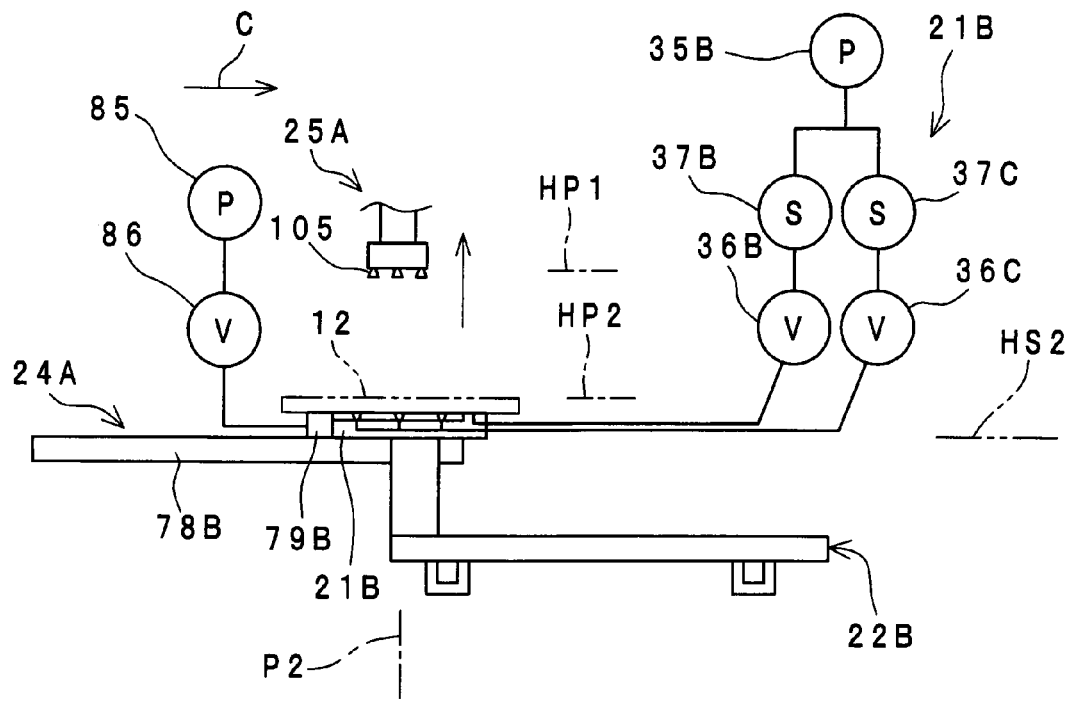
FIG. 17E is a schematic side view of the procedure for moving the substrate from the substrate transfer apparatus to the panel stage.

In the warpage correction process at steps S16-6 and S16-9, the rod 103a of the air cylinder 103 of the warpage correction apparatus 25A falls from the raised position HP1 to the lower position HP2 as shown in FIGS. 17C and 17D. In the lower position HP2, the cushion pads 105 abut against the upper face of the substrate 12, and thereby the substrate 12 is pushed in a downward direction onto the upper surface of the substrate stage 21B. As a result, the substrate 12 is held onto the substrate stage 21B in a state of suitable flatness in which the warpage has been reduced. After the substrate 12 has been pushed by the cushion pads 105 for a predetermined time, the rod 103a of the air cylinder 103 returns from the lower position HP2 to the raised position HP1 as shown in FIG. 17E. By executing the warpage correction process, the positional displacement of the substrate 12 during delivery owing to the warpage of the substrate 12 can be prevented. As a result, the accuracy of the pre-press bonding process to the substrate 12 in the working section 23B can be improved. Further, because leakage is reduced by correcting the warpage of the substrate 12, the holding force with which the suction pads 31B and suction holes 73A hold the substrate 12 onto the substrate stage 21B is rapidly raised. Accordingly, the time necessary for delivering the substrate 12 can be shortened and the takt can be improved.

In this embodiment, the warpage correction process of steps S16-6 and S16-9 is repeated until the detection values of the vacuum pressure sensors 37B and 37C are equal to or more than the threshold in steps S16-4 and S16-7. However, if the detection values of the vacuum pressure sensors 37B and 37C do not become equal to or more than the threshold even though the warpage correction process is executed once or a plurality of times, that is, if the substrate 12 cannot be held by the substrate stage 21B with sufficient holding force even though the warpage correction process has been executed, error process such as process for stopping the operation of the device may be executed.

Figure 17F:
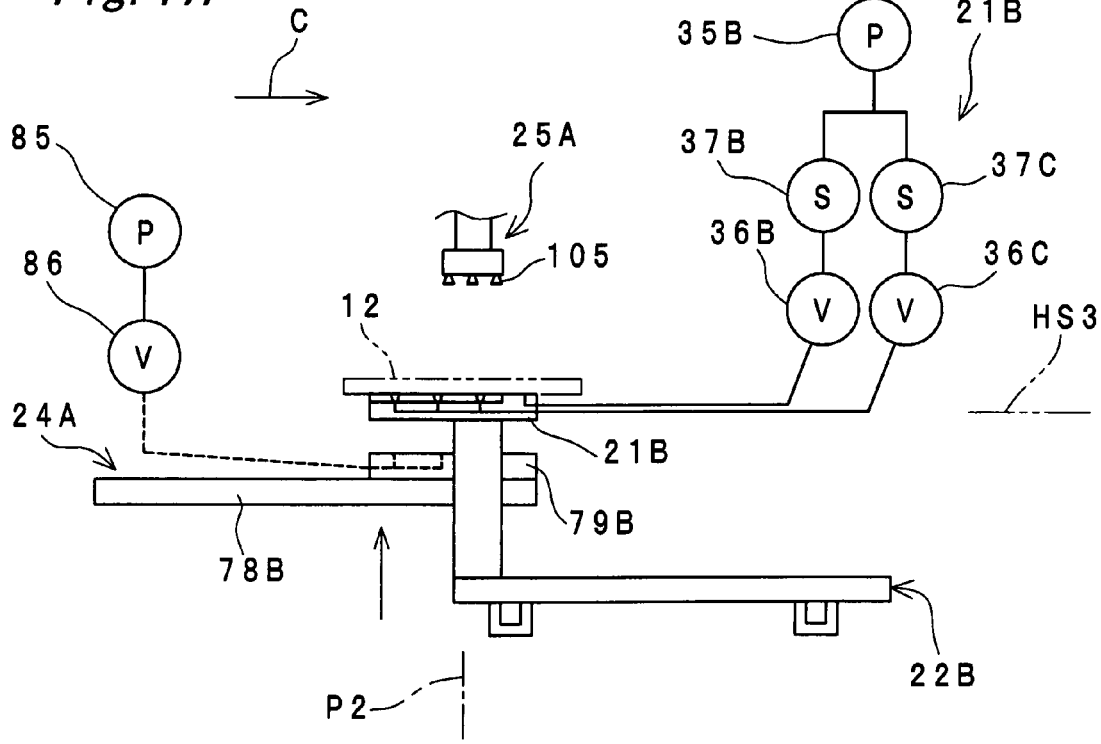
FIG. 17F is a schematic side view of the procedure for moving the substrate from the substrate transfer apparatus to the panel stage.

After the substrate 12 is held by the substrate stage 21B at step S16-8, the substrate stage 21B rises as shown in FIGS. 17E and 17F at step S16-10. The substrate stage 21B rises from the height position HS2 to a height position HS3 above the substrate holding sliders 79A and 79B. When the substrate stage 21B rises to height position HS3, the substrate 12 is lifted from the substrate holding sliders 79A and 79B.

Figure 17G:
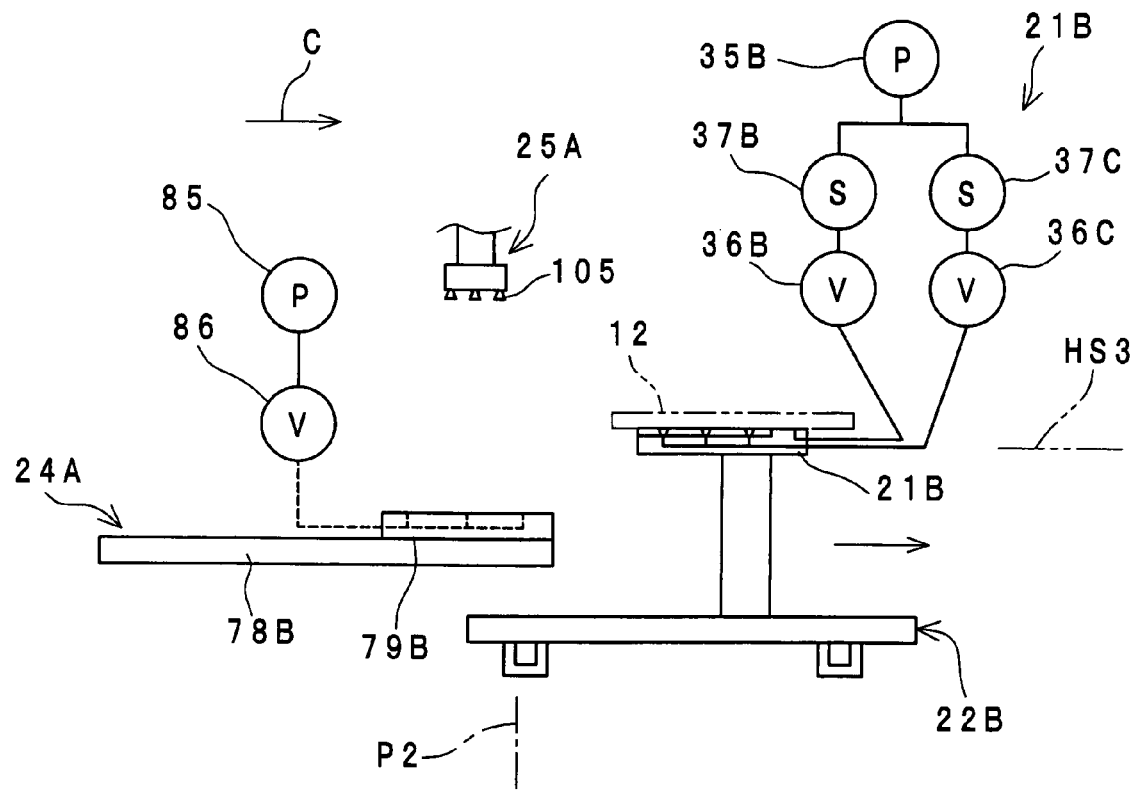
FIG. 17G is a schematic side view of a procedure for moving the substrate from the substrate transfer apparatus to the panel stage.
Figure 17H:
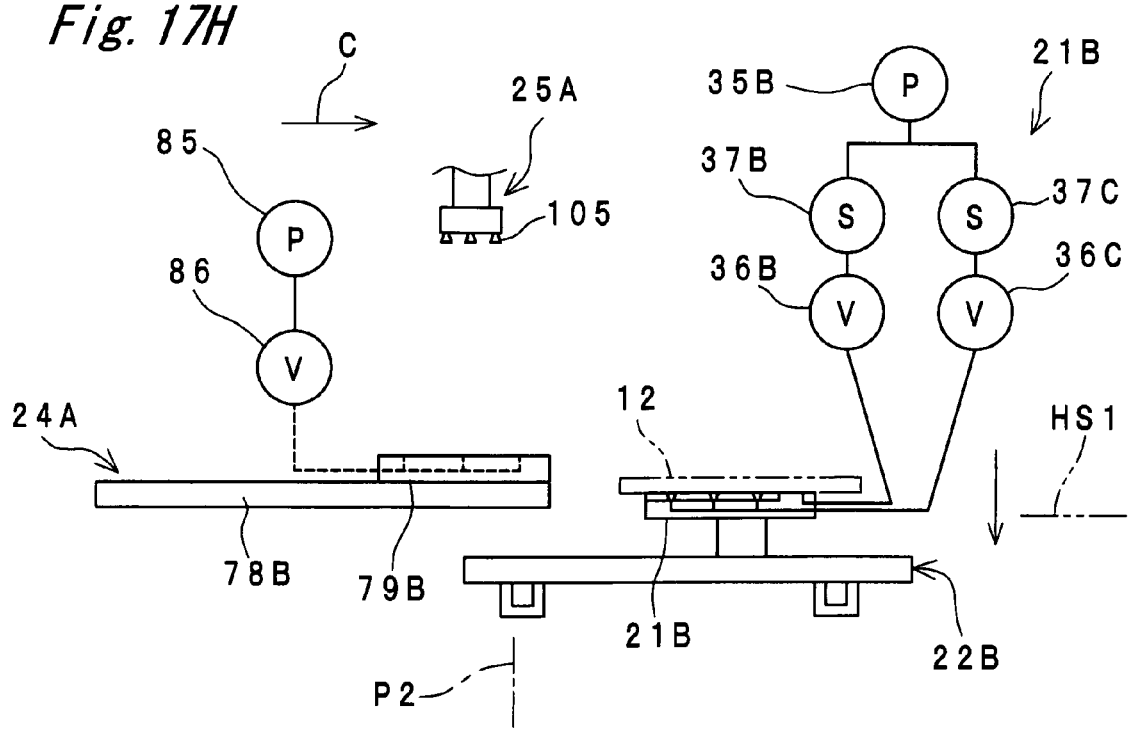
FIG. 17H is a schematic side view of the procedure for moving the substrate from the substrate transfer apparatus to the panel stage.

Finally, at step S16-11, the substrate stage 21B holding the substrate 12 moves from the second substrate taking-over position P2 to the working section 23B. Specifically, as shown in FIG. 17G, the substrate stage 21B moves in the +X direction (transfer direction "C") to leave the interval G2 between the substrate holding sliders 79A and 79B. At this stage, the substrate stage 21B need not move in the direction orthogonal to the transfer direction "C" (Y-axis direction) in order to avoid interference with the substrate holding sliders 79A and 79B. Thereafter, the substrate stage 21B that has left the substrate taking-over position P2 falls to the height position HS1 as shown in FIG. 17H and moves toward the working section 23B. As a result of the above operation, the delivery of the substrate 12 from the substrate transfer apparatus 24A to the substrate stage 21B of the pre-press bonding apparatus 16 at the second substrate taking-over position P2 is completed.

Then, the delivery of the substrate 12 from the substrate stage 21B to the substrate transfer apparatus 24B at the third substrate taking-over position P3 will be described. In the following description a flowchart of FIG. 18 and the schematic diagrams of FIGS. 19A to 19D are mainly referred to. Further, for the elements not illustrated in FIGS. 19A to 19D, reference is made to FIG. 3 and FIGS. 7 to 12.

Figure 19A:
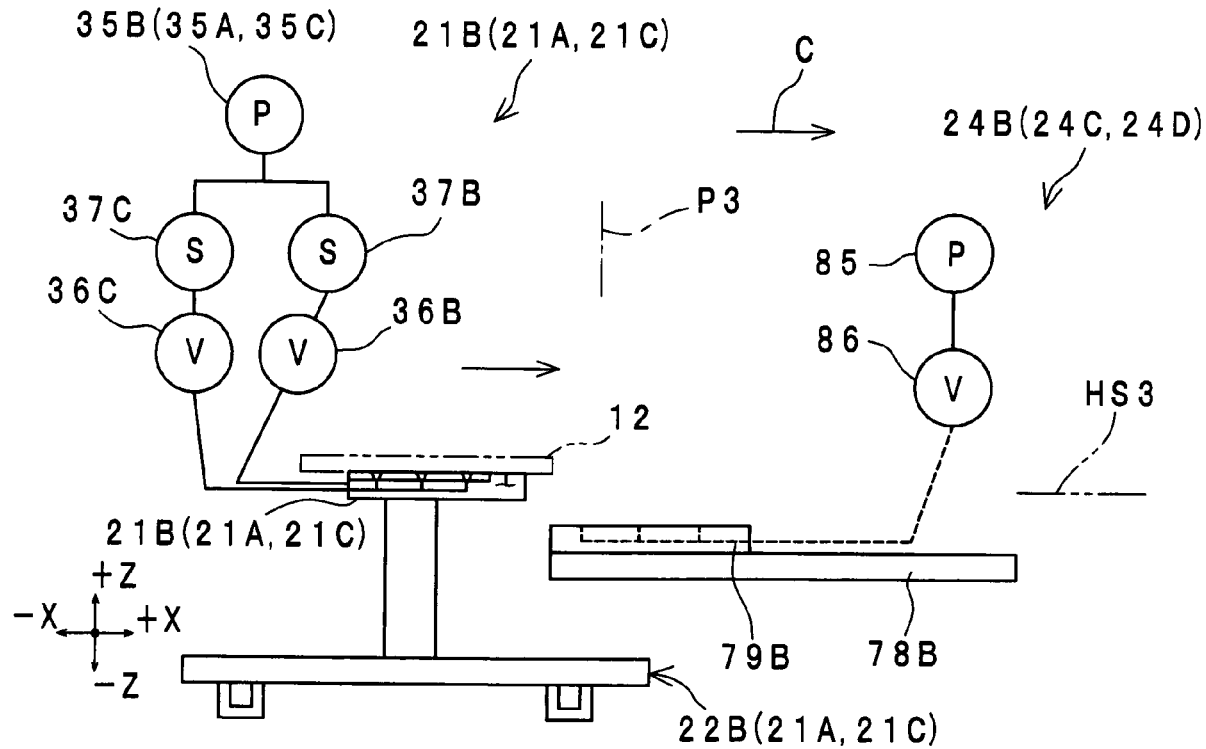
FIG. 19A is a schematic side view of the procedure for moving the substrate from the panel stage to the substrate transfer apparatus.

As shown in FIG. 19A, the substrate holding sliders 79A and 79B of the substrate transfer apparatus 24B move to the third substrate taking-over position P3. The valve 86B is closed. On the other hand, the valves 36B and 36C are open and the substrate 12 is held on the substrate stage 21B by the suction force of the vacuum source 35B acting via the suction holes 73A and the suction pads 31B. Further, the substrate stage 21B is located in the height position HS3.

Figure 18:
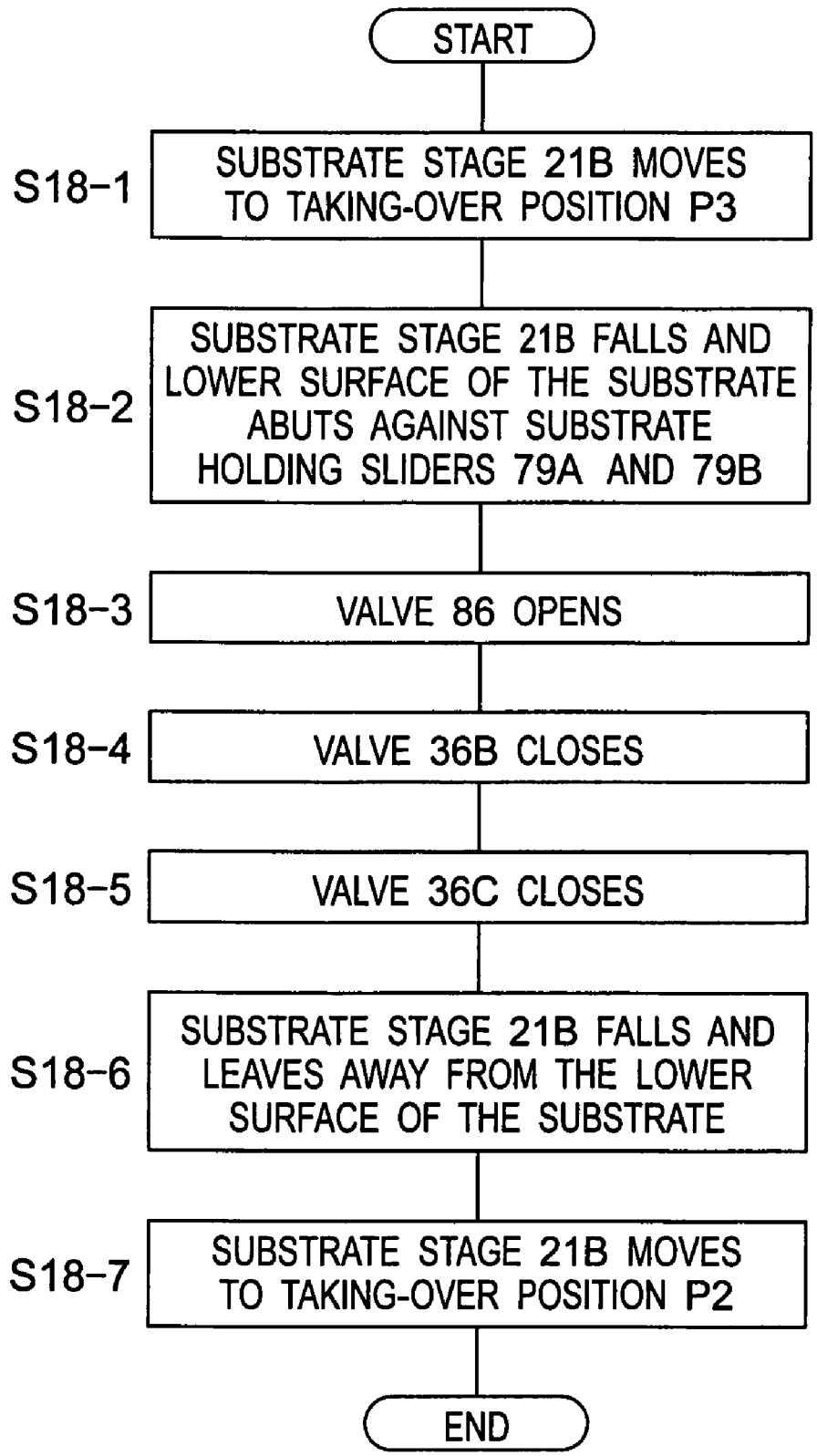
FIG. 18 is a flowchart for illustrating a procedure for moving the substrate from the panel stage to the substrate transfer apparatus.
Figure 19B:
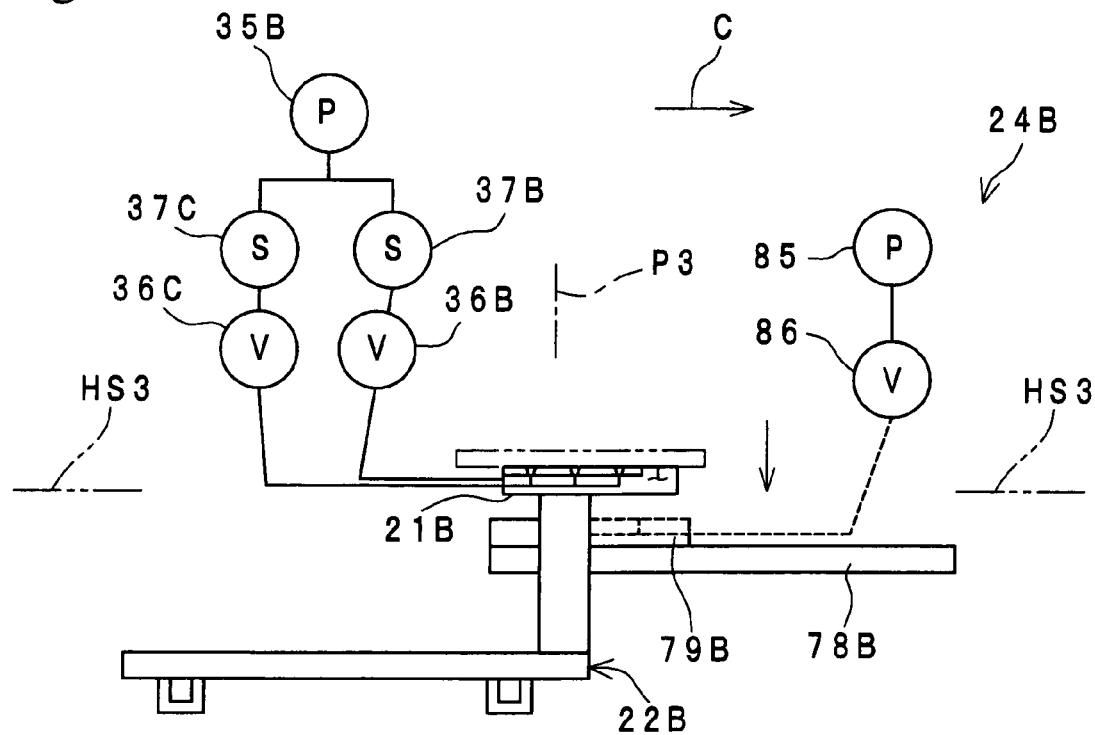
FIG. 19B is a schematic side view of the procedure for moving the substrate from the panel stage to the substrate transfer apparatus.

At step S18-1 of FIG. 18, the substrate stage 21B moves in the +X direction toward the third substrate taking-over position P3. As shown in FIGS. 19A and 19B, the substrate stage 21B moves to the interval G2 between the substrate holding sliders 79A and 79B. As a result, the substrate stage 21B and substrate 12 are located above the substrate holding sliders 79A and 79B.

Figure 19C:
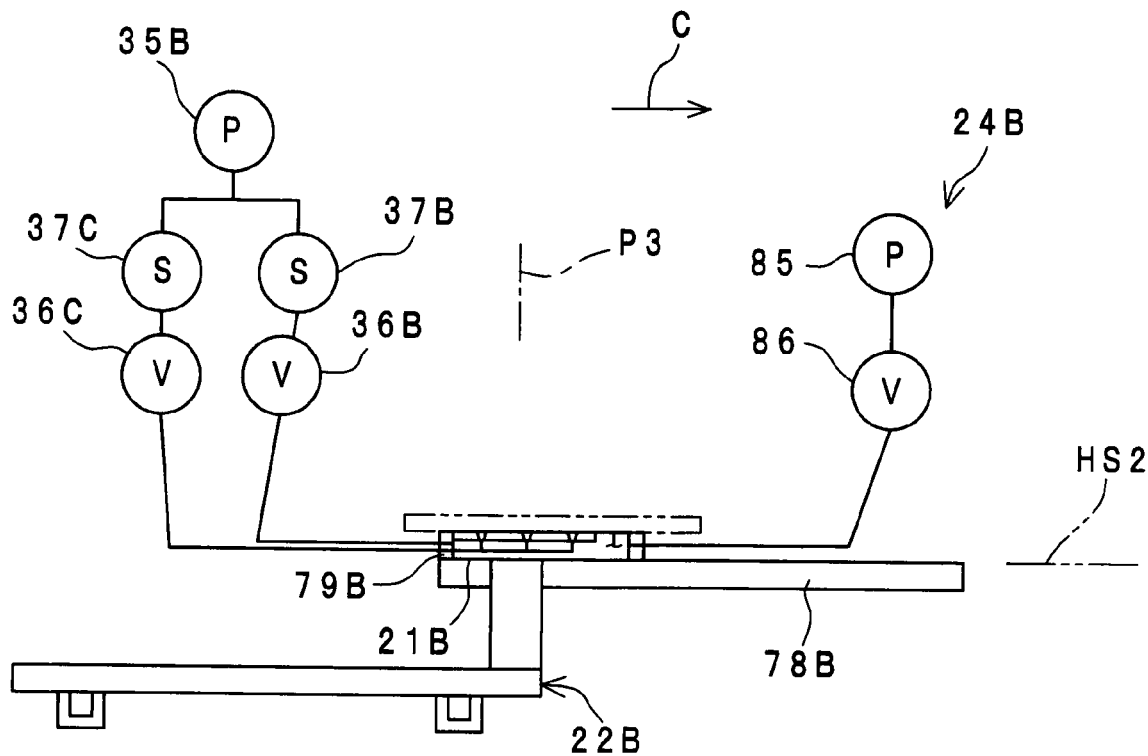
FIG. 19C is a schematic side view of the procedure for moving the substrate from the panel stage to the substrate transfer apparatus.
Figure 19D:
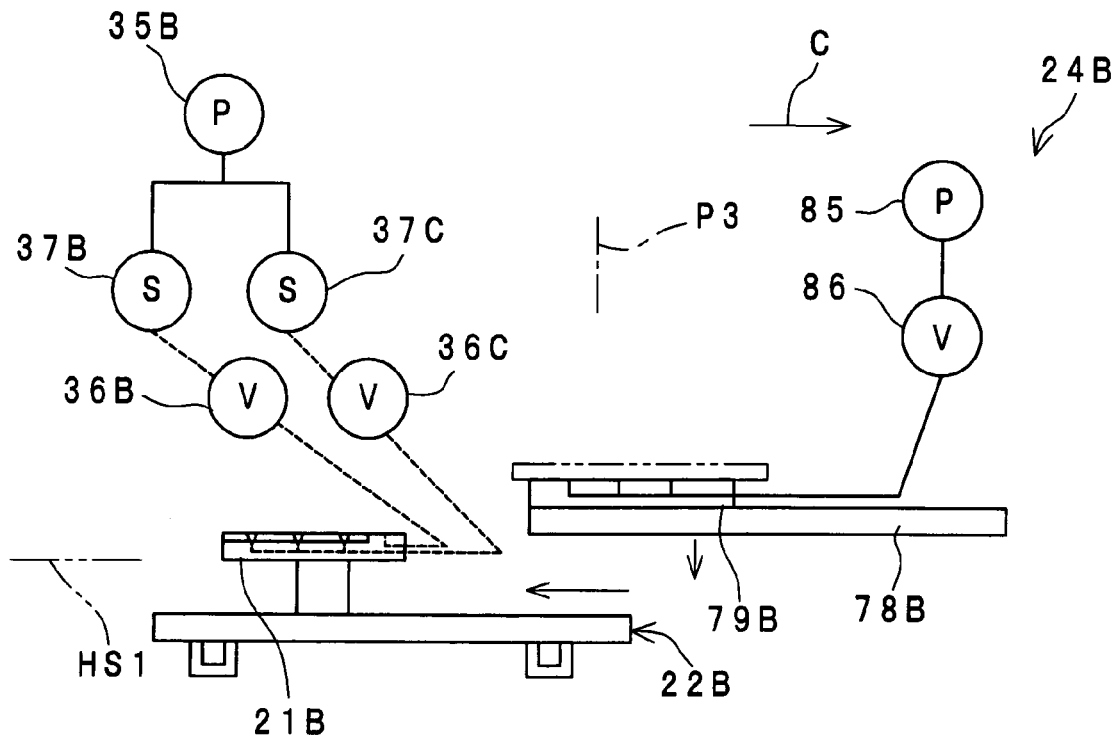
FIG. 19D is a schematic side view of the procedure for moving the substrate from the panel stage to the substrate transfer apparatus.
Figure 20:
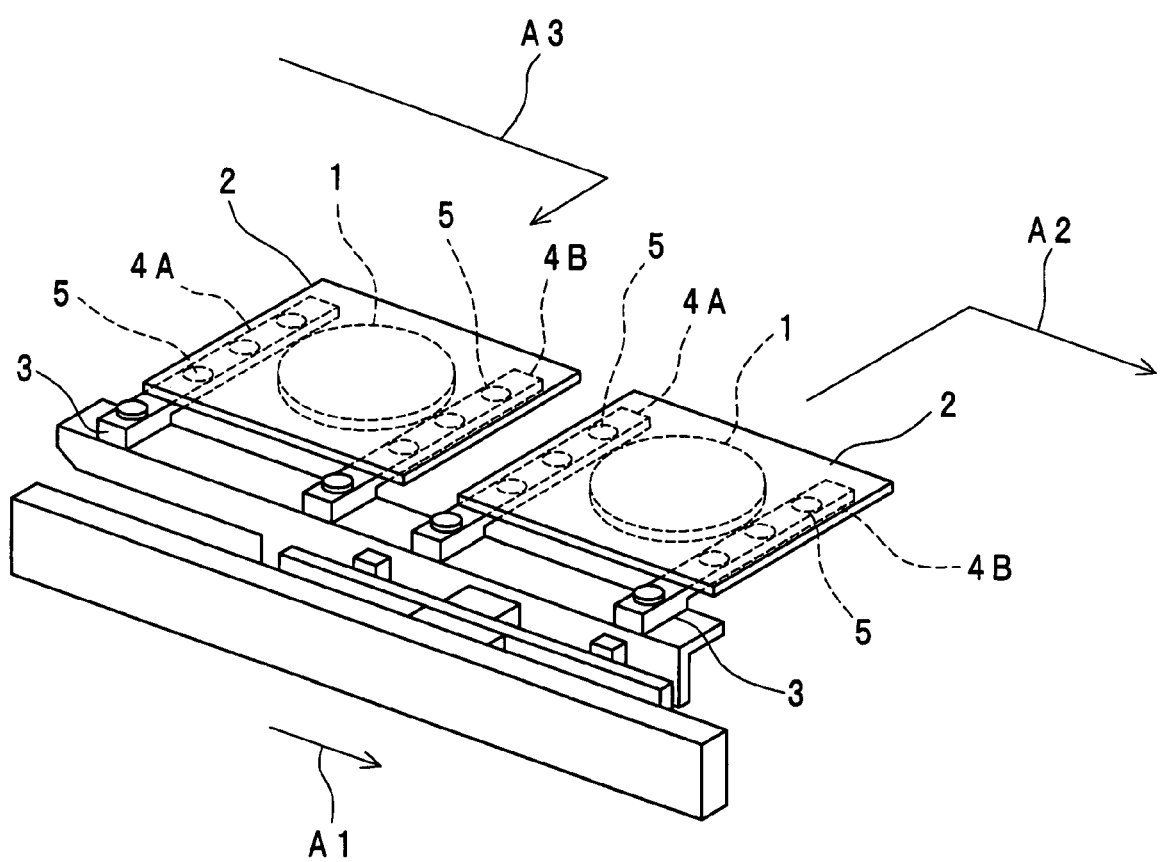
FIG. 20 is a partial perspective view of conventional component mounting equipment.

Thereafter, at step S18-2, substrate stage 21B falls. As shown in FIGS. 19B and 19C, the substrate stage 21B falls from the height position HS3 to the height position HS2. As a result, the lower surface of the substrate 12 held on the substrate stage 21B abuts against the upper surfaces of the substrate holding sliders 79A and 79B.

After the lower surface of the substrate 12 has abutted against the substrate holding sliders 79A and 79B, the valve 86 is opened at step S18-3. Accordingly, the suction force of the vacuum source 85 acts via the suction pads 83 on the lower surface of the substrate 12 and the substrate 12 is held onto the substrate holding sliders 79A and 79B of the substrate transfer apparatus 24B. Thereafter, at step S18-4, valve 36B is closed. Accordingly, the holding of the first and second supported portions 12c and 12d of the substrate 12 (the portions adjacent to the first and second mounting regions 12a and 12b) by the suction holes 73A of the rigid portion 71 is released. Further, at step S18-5, valve 36C is opened. As a result, the holding of the third supported portion 12e of the substrate 12 (the portion spaced apart from the first and second mounting regions 12a and 12b) by the suction pads 31B is released. As a result of the operation of the valves 36B, 36C, and 86 at steps S18-3, S18-4, and S18-5, there occurs switching from a state where the substrate 12 is held by the substrate stage 21B to a state where the substrate 12 is held by the substrate holding sliders 79A and 79B of the substrate transfer apparatus 24A.

At step S18-6, the substrate stage 21B falls to the height position HS1 and the substrate stage 12 leaves the lower surface of the substrate 12. Thereafter, at step S18-7, the substrate stage 21 moves in the −X direction from the third substrate taking-over position P3 to the second substrate taking-over position P2. As a result of the above operation, the delivery of the substrate 12 from the substrate stage 21B to the substrate transfer apparatus 24B at the third substrate taking-over position P3 is complete.

The invention claimed is:

1. A method for transferring a substrate, comprising:
    providing a mounting apparatus including first and second substrate holding sections, a first substrate stage and a second substrate stage;
    moving the first and second substrate holding sections opposite to each other with an interval therebetween in a direction intersecting a transfer direction of a substrate to a first substrate taking-over position;
    moving the first substrate stage holding the substrate in the transfer direction so as to be disposed in the interval between the first and second substrate holding sections located in the first substrate taking-over position;
    delivering the substrate from the first substrate stage to the first and second substrate holding sections by releasing the substrate from the first substrate stage and holding the substrate with the first and second substrate holding sections;
    moving the first and second substrate holding sections holding the substrate from the first substrate taking-over position to a second substrate taking-over position;
    moving the second substrate stage in the transfer direction so as to be disposed in the interval between the first and second substrate holding sections located at the second substrate taking-over position; and
    delivering the substrate from the first and second substrate holding sections to the second substrate stage by releasing the substrate from the first and second substrate holding sections and holding the substrate with the second substrate stage.

2. The method according to claim 1, wherein the delivering the substrate from the first and second substrate holding sections to the second substrate stage comprises:
    raising the second substrate stage from a first height position spaced apart from a lower surface of the substrate held by the first and second substrate holding sections to a second height position in which the second substrate stage abuts against the lower surface of the substrate held by the first and second substrate holding sections;
    holding the substrate with the second substrate stage using a holding mechanism;
    detecting a holding force on the substrate by the holding mechanism by a sensor;
    wherein when a value detected by the sensor is equal to or more than a predetermined threshold, the second substrate stage is moved from the second height position to a third height position in which the substrate is spaced apart from the first and second substrate holding sections after the holding of the substrate by the first and second substrate holding sections is released; and
    wherein when the value detected by the sensor is less than the predetermined threshold, the substrate is pushed onto the second substrate stage by a warpage correction section.

* * * * *